(12) United States Patent
Kumar et al.

(10) Patent No.: US 11,980,992 B2
(45) Date of Patent: May 14, 2024

(54) INTEGRATED ABRASIVE POLISHING PADS AND MANUFACTURING METHODS

(71) Applicant: Applied Materials, Inc., Santa Clara, CA (US)

(72) Inventors: Ashavani Kumar, Sunnyvale, CA (US); Ashwin Chockalingam, Santa Clara, CA (US); Sivapackia Ganapathiappan, Los Altos, CA (US); Rajeev Bajaj, San Jose, CA (US); Boyi Fu, San Jose, CA (US); Daniel Redfield, Morgan Hill, CA (US); Nag B. Patibandla, Pleasanton, CA (US); Mario Dagio Cornejo, San Jose, CA (US); Amritanshu Sinha, Sunnyvale, CA (US); Yan Zhao, Santa Clara, CA (US); Ranga Rao Arnepalli, Andhra Pradesh (IN); Fred C. Redeker, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/946,547

(22) Filed: Sep. 16, 2022

(65) Prior Publication Data
US 2023/0052048 A1 Feb. 16, 2023

Related U.S. Application Data

(62) Division of application No. 16/042,016, filed on Jul. 23, 2018, now Pat. No. 11,471,999.
(Continued)

(51) Int. Cl.
*B24B 37/24* (2012.01)
*B24B 37/16* (2012.01)
(Continued)

(52) U.S. Cl.
CPC ............ *B24B 37/245* (2013.01); *B24B 37/26* (2013.01); *B24D 11/04* (2013.01); *B24D 18/00* (2013.01);
(Continued)

(58) Field of Classification Search
CPC ....... B24B 37/20; B24B 37/245; B24B 37/26; B33Y 80/00; B29C 64/112
See application file for complete search history.

(56) References Cited

U.S. PATENT DOCUMENTS 2,001,911 A 5/1935 Wooddell et al.
3,357,598 A 12/1967 Kraft
(Continued)

FOREIGN PATENT DOCUMENTS

CN 1441017 A 9/2003
CN 1851896 A 10/2006
(Continued)

OTHER PUBLICATIONS

Korean Office Action dated Sep. 27, 2022 for Application No. 10-2020-7005485.
(Continued)

*Primary Examiner* — Pegah Parvini
(74) *Attorney, Agent, or Firm* — Patterson + Sheridan, LLP

(57) ABSTRACT

Embodiments described herein relate to integrated abrasive (IA) polishing pads, and methods of manufacturing IA polishing pads using, at least in part, surface functionalized abrasive particles in an additive manufacturing process, such as a 3D inkjet printing process. In one embodiment, a method of forming a polishing article includes dispensing a first plurality of droplets of a first precursor, curing the first plurality of droplets to form a first layer comprising a portion of a sub-polishing element, dispensing a second plurality of
(Continued)

droplets of the first precursor and a second precursor onto the first layer, and curing the second plurality of droplets to form a second layer comprising portions of the sub-polishing element and portions of a plurality of polishing elements. Here, the second precursor includes functionalized abrasive particles having a polymerizable group chemically bonded to surfaces thereof.

19 Claims, 9 Drawing Sheets

Related U.S. Application Data

(60) Provisional application No. 62/537,290, filed on Jul. 26, 2017.

(51) Int. Cl.
  *B24B 37/20* (2012.01)
  *B24B 37/26* (2012.01)
  *B24D 11/04* (2006.01)
  *B24D 18/00* (2006.01)
  *B29C 64/112* (2017.01)
  *B33Y 10/00* (2015.01)
  *B33Y 30/00* (2015.01)
  *B33Y 80/00* (2015.01)
  *H01L 21/306* (2006.01)

(52) U.S. Cl.
  CPC ............ *B29C 64/112* (2017.08); *B33Y 10/00* (2014.12); *B33Y 80/00* (2014.12); *B24B 37/16* (2013.01); *B24B 37/20* (2013.01); *B24D 2203/00* (2013.01); *B33Y 30/00* (2014.12); *H01L 21/30625* (2013.01)

(56) References Cited

U.S. PATENT DOCUMENTS

| | | |
|---|---|---|
| 3,741,116 A | 6/1973 | Green et al. |
| 4,459,779 A | 7/1984 | Shen |
| 4,575,330 A | 3/1986 | Hull |
| 4,836,832 A | 6/1989 | Tumey et al. |
| 4,841,680 A | 6/1989 | Hoffstein et al. |
| 4,844,144 A | 7/1989 | Murphy et al. |
| 4,942,001 A | 7/1990 | Murphy et al. |
| 4,960,673 A | 10/1990 | Beck et al. |
| 5,096,530 A | 3/1992 | Cohen |
| 5,120,476 A | 6/1992 | Scholz |
| 5,121,329 A | 6/1992 | Crump |
| 5,178,646 A | 1/1993 | Barber, Jr. et al. |
| 5,193,316 A | 3/1993 | Olmstead |
| 5,212,910 A | 5/1993 | Breivogel et al. |
| 5,287,663 A | 2/1994 | Pierce et al. |
| 5,300,417 A | 4/1994 | Lushington et al. |
| 5,378,527 A | 1/1995 | Nakanishi et al. |
| 5,470,368 A | 11/1995 | Culler |
| 5,533,923 A | 7/1996 | Shamouilian et al. |
| 5,605,499 A | 2/1997 | Sugiyama et al. |
| 5,605,760 A | 2/1997 | Roberts |
| 5,609,517 A | 3/1997 | Lofaro |
| 5,624,303 A | 4/1997 | Robinson |
| 5,626,919 A | 5/1997 | Chapman et al. |
| 5,645,471 A | 7/1997 | Strecker |
| 5,664,986 A | 9/1997 | Roh |
| 5,690,540 A | 11/1997 | Elliott et al. |
| 5,738,574 A | 4/1998 | Tolles et al. |
| 5,778,481 A | 7/1998 | Amsden et al. |
| 5,795,218 A | 8/1998 | Doan et al. |
| 5,876,268 A | 3/1999 | Lamphere et al. |
| 5,876,490 A | 3/1999 | Ronay |
| 5,888,121 A | 3/1999 | Kirchner et al. |
| 5,900,164 A | 5/1999 | Budinger et al. |
| 5,905,099 A | 5/1999 | Everaerts et al. |
| 5,906,863 A | 5/1999 | Lombardi et al. |
| 5,910,471 A | 6/1999 | Christianson et al. |
| 5,919,082 A | 7/1999 | Walker et al. |
| 5,921,855 A | 7/1999 | Osterheld et al. |
| 5,932,040 A | 8/1999 | Audisio |
| 5,932,290 A | 8/1999 | Lombardi et al. |
| 5,940,674 A | 8/1999 | Sachs et al. |
| 5,944,583 A | 8/1999 | Cruz et al. |
| 5,951,380 A | 9/1999 | Kim |
| 5,965,460 A | 10/1999 | Rach et al. |
| 5,976,000 A | 11/1999 | Hudson |
| 5,984,769 A | 11/1999 | Bennett et al. |
| 5,989,111 A | 11/1999 | Lamphere et al. |
| 5,989,470 A | 11/1999 | Doan et al. |
| 6,017,609 A | 1/2000 | Akamatsu et al. |
| 6,022,264 A | 2/2000 | Cook et al. |
| 6,029,096 A | 2/2000 | Manners et al. |
| 6,036,579 A | 3/2000 | Cook et al. |
| 6,062,968 A | 5/2000 | Sevilla et al. |
| 6,077,581 A | 6/2000 | Kuramochi et al. |
| 6,090,475 A | 7/2000 | Robinson et al. |
| 6,095,902 A | 8/2000 | Reinhardt |
| 6,117,000 A | 9/2000 | Anjur et al. |
| 6,121,143 A | 9/2000 | Messner et al. |
| 6,122,564 A | 9/2000 | Koch et al. |
| 6,126,532 A | 10/2000 | Sevilla et al. |
| 6,155,910 A | 12/2000 | Lamphere et al. |
| 6,176,992 B1 | 1/2001 | Talieh |
| 6,206,759 B1 | 3/2001 | Agarwal et al. |
| 6,210,254 B1 | 4/2001 | Cook et al. |
| 6,213,845 B1 | 4/2001 | Elledge |
| 6,228,133 B1 | 5/2001 | Thurber et al. |
| 6,231,629 B1 | 5/2001 | Christianson et al. |
| 6,231,942 B1 | 5/2001 | Blizard et al. |
| 6,241,596 B1 | 6/2001 | Osterheld et al. |
| 6,254,460 B1 | 7/2001 | Walker et al. |
| 6,257,973 B1 | 7/2001 | Fernand Guiselin |
| 6,267,641 B1 | 7/2001 | Vanell et al. |
| 6,273,806 B1 | 8/2001 | Bennett et al. |
| 6,309,276 B1 | 10/2001 | Tsai et al. |
| 6,309,282 B1 | 10/2001 | Wright et al. |
| 6,319,108 B1 | 11/2001 | Adefris et al. |
| 6,322,728 B1 | 11/2001 | Brodkin et al. |
| 6,325,706 B1 | 12/2001 | Krusell et al. |
| 6,328,634 B1 | 12/2001 | Shen et al. |
| 6,332,832 B1 | 12/2001 | Suzuki |
| 6,338,901 B1 | 1/2002 | Veerasamy |
| 6,361,411 B1 | 3/2002 | Chopra et al. |
| 6,361,832 B1 | 3/2002 | Agarwal et al. |
| 6,368,184 B1 | 4/2002 | Beckage |
| 6,390,890 B1 | 5/2002 | Molnar |
| 6,399,501 B2 | 6/2002 | Birang et al. |
| 6,402,604 B2 | 6/2002 | Guiselin |
| 6,423,255 B1 | 7/2002 | Hoechsmann et al. |
| 6,428,586 B1 | 8/2002 | Yancey |
| 6,454,634 B1 | 9/2002 | James et al. |
| 6,477,926 B1 | 11/2002 | Swisher et al. |
| 6,488,570 B1 | 12/2002 | James et al. |
| 6,500,053 B2 | 12/2002 | James et al. |
| 6,506,097 B1 | 1/2003 | Adams et al. |
| 6,518,162 B2 | 2/2003 | Ono et al. |
| 6,520,834 B1 | 2/2003 | Marshall |
| 6,520,847 B2 | 2/2003 | Osterheld et al. |
| 6,544,373 B2 | 4/2003 | Chen et al. |
| 6,548,407 B1 | 4/2003 | Chopra et al. |
| 6,569,373 B2 | 5/2003 | Napadensky |
| 6,582,283 B2 | 6/2003 | James et al. |
| 6,585,563 B1 | 7/2003 | Redeker et al. |
| 6,586,494 B2 | 7/2003 | Mejiritski et al. |
| 6,592,443 B1 | 7/2003 | Kramer et al. |
| 6,641,463 B1 | 11/2003 | Molnar |
| 6,641,471 B1 | 11/2003 | Pinheiro et al. |
| 6,645,061 B1 | 11/2003 | Bennett et al. |
| 6,682,402 B1 | 1/2004 | Roberts et al. |
| 6,684,704 B1 | 2/2004 | Obeng |
| 6,685,548 B2 | 2/2004 | Chen et al. |
| 6,692,338 B1 | 2/2004 | Kirchner |
| 6,699,115 B2 | 3/2004 | Osterheld et al. |

(56) References Cited

U.S. PATENT DOCUMENTS

| | | |
|---|---|---|
| 6,719,818 B1 | 4/2004 | Birang et al. |
| 6,736,709 B1 | 5/2004 | James et al. |
| 6,736,714 B2 | 5/2004 | Dudovicz |
| 6,746,225 B1 | 6/2004 | McHugh |
| 6,746,311 B1 | 6/2004 | Kessel |
| 6,749,485 B1 | 6/2004 | James et al. |
| 6,749,714 B1 | 6/2004 | Ishikawa et al. |
| 6,773,474 B2 | 8/2004 | Koehnle et al. |
| 6,783,436 B1 | 8/2004 | Muldowney |
| 6,790,883 B2 | 9/2004 | Ogawa et al. |
| 6,796,880 B2 | 9/2004 | Redeker et al. |
| 6,811,680 B2 | 11/2004 | Chen et al. |
| 6,811,937 B2 | 11/2004 | Lawton |
| 6,815,570 B1 | 11/2004 | Negiz et al. |
| 6,833,046 B2 | 12/2004 | Wright |
| 6,838,149 B2 | 1/2005 | Lugg |
| 6,840,843 B2 | 1/2005 | Jones et al. |
| 6,843,711 B1 | 1/2005 | Muldowney |
| 6,847,014 B1 | 1/2005 | Benjamin et al. |
| 6,855,588 B1 | 2/2005 | Liao et al. |
| 6,860,793 B2 | 3/2005 | Budinger et al. |
| 6,860,802 B1 | 3/2005 | Vishwanathan et al. |
| 6,866,807 B2 | 3/2005 | Comb et al. |
| 6,869,350 B2 | 3/2005 | Roberts et al. |
| 6,875,096 B2 | 4/2005 | Park et al. |
| 6,875,097 B2 | 4/2005 | Grunwald |
| 6,887,137 B2 | 5/2005 | Lee et al. |
| 6,896,593 B2 | 5/2005 | Prasad |
| 6,913,517 B2 | 7/2005 | Prasad |
| 6,935,931 B2 | 8/2005 | Prasad |
| 6,955,588 B1 | 10/2005 | Anderson, II et al. |
| 6,984,163 B2 | 1/2006 | Roberts |
| 6,991,517 B2 | 1/2006 | Redeker et al. |
| 6,991,528 B2 | 1/2006 | Hu et al. |
| 6,998,166 B2 | 2/2006 | Prasad |
| 7,018,560 B2 | 3/2006 | Liu et al. |
| 7,029,747 B2 | 4/2006 | Huh et al. |
| 7,044,836 B2 | 5/2006 | Sun et al. |
| 7,059,949 B1 | 6/2006 | Elmufdi et al. |
| 7,059,950 B1 | 6/2006 | Muldowney |
| 7,077,879 B2 | 7/2006 | Ogawa et al. |
| 7,120,512 B2 | 10/2006 | Kramer et al. |
| 7,125,318 B2 | 10/2006 | Muldowney |
| 7,132,033 B2 | 11/2006 | Boldizar et al. |
| 7,166,017 B2 | 1/2007 | Minamihaba et al. |
| 7,169,030 B1 | 1/2007 | Kulp |
| 7,186,164 B2 | 3/2007 | Manens |
| 7,186,322 B2 | 3/2007 | Sato et al. |
| 7,192,336 B2 | 3/2007 | Kramer et al. |
| 7,195,544 B2 | 3/2007 | Prasad |
| 7,204,742 B2 | 4/2007 | Prasad |
| 7,234,224 B1 | 6/2007 | Naugler et al. |
| 7,252,871 B2 | 8/2007 | Crkvenac et al. |
| 7,264,641 B2 | 9/2007 | Prasad |
| 7,267,607 B2 | 9/2007 | Prasad |
| 7,267,610 B1 | 9/2007 | Elmufdi et al. |
| 7,268,173 B2 | 9/2007 | Graichen et al. |
| 7,300,340 B1 | 11/2007 | Elmufdi et al. |
| 7,300,619 B2 | 11/2007 | Napadensky et al. |
| 7,311,590 B1 | 12/2007 | Muldowney |
| 7,311,862 B2 | 12/2007 | Prasad |
| 7,332,104 B2 | 2/2008 | Minamihaba et al. |
| 7,357,698 B2 | 4/2008 | Choi |
| 7,371,160 B1 | 5/2008 | Cruz et al. |
| 7,377,840 B2 | 5/2008 | Deopura et al. |
| 7,382,959 B1 | 6/2008 | Jacobsen |
| 7,425,172 B2 | 9/2008 | Misra et al. |
| 7,425,250 B2 | 9/2008 | Basol et al. |
| 7,427,340 B2 | 9/2008 | Mavliev et al. |
| 7,435,161 B2 | 10/2008 | Prasad et al. |
| 7,435,165 B2 | 10/2008 | Prasad |
| 7,438,636 B2 | 10/2008 | Kulp et al. |
| 7,438,795 B2 | 10/2008 | Wylie et al. |
| 7,445,847 B2 | 11/2008 | Kulp |
| 7,455,571 B1 | 11/2008 | Kuo et al. |
| 7,497,885 B2 | 3/2009 | Kollodge |
| 7,513,818 B2 | 4/2009 | Miller et al. |
| 7,517,277 B2 | 4/2009 | Muldowney |
| 7,517,488 B2 | 4/2009 | Saikin |
| 7,520,798 B2 | 4/2009 | Muldowney |
| 7,524,345 B2 | 4/2009 | Nevoret et al. |
| 7,530,880 B2 | 5/2009 | Bajaj et al. |
| 7,531,117 B2 | 5/2009 | Ederer et al. |
| 7,537,446 B2 | 5/2009 | James et al. |
| 7,582,127 B2 | 9/2009 | Vacassy et al. |
| 7,635,290 B2 | 12/2009 | Muldowney |
| 7,648,645 B2 | 1/2010 | Roberts et al. |
| 7,652,286 B2 | 1/2010 | Isobe et al. |
| 7,699,684 B2 | 4/2010 | Prasad |
| 7,704,122 B2 | 4/2010 | Misra et al. |
| 7,704,125 B2 | 4/2010 | Roy et al. |
| 7,731,568 B2 | 6/2010 | Shimomura et al. |
| 7,754,118 B2 | 7/2010 | Huh et al. |
| 7,762,870 B2 | 7/2010 | Ono et al. |
| 7,815,778 B2 | 10/2010 | Bajaj |
| 7,828,634 B2 | 11/2010 | Jiang et al. |
| 7,840,305 B2 | 11/2010 | Behr et al. |
| 7,846,008 B2 | 12/2010 | Bajaj |
| 7,871,309 B2 | 1/2011 | Ogawa et al. |
| 7,875,091 B2 | 1/2011 | Nevorct et al. |
| 7,926,521 B2 | 4/2011 | Izumoto et al. |
| 7,935,276 B2 | 5/2011 | Zhou et al. |
| 7,943,681 B2 | 5/2011 | Lee et al. |
| 7,976,901 B2 | 7/2011 | Kume et al. |
| 8,047,899 B2 | 11/2011 | Chen et al. |
| 8,053,487 B2 | 11/2011 | Ragain, Jr. et al. |
| 8,057,282 B2 | 11/2011 | Muldowney |
| 8,062,102 B2 | 11/2011 | Park et al. |
| 8,062,103 B2 | 11/2011 | Muldowney |
| 8,066,555 B2 | 11/2011 | Bajaj |
| 8,067,814 B2 | 11/2011 | Takehara et al. |
| 8,075,372 B2 | 12/2011 | Prasad |
| 8,075,745 B2 | 12/2011 | Bajaj |
| 8,083,820 B2 | 12/2011 | Kollodge et al. |
| 8,111,603 B2 | 2/2012 | Nishimura et al. |
| 8,118,641 B2 | 2/2012 | Kulp et al. |
| 8,142,860 B2 | 3/2012 | Vanmaele et al. |
| 8,142,869 B2 | 3/2012 | Kobayashi et al. |
| 8,172,648 B2 | 5/2012 | Lefevre et al. |
| 8,177,603 B2 | 5/2012 | Bajaj |
| 8,211,543 B2 | 7/2012 | Kato et al. |
| 8,257,545 B2 | 9/2012 | Loyack et al. |
| 8,260,447 B2 | 9/2012 | Mattes et al. |
| 8,282,866 B2 | 10/2012 | Hiraide |
| 8,287,793 B2 | 10/2012 | Deopura et al. |
| 8,288,448 B2 | 10/2012 | Kulp |
| 8,292,592 B2 | 10/2012 | Welch et al. |
| 8,292,692 B2 | 10/2012 | Bajaj |
| 8,337,282 B2 | 12/2012 | Park et al. |
| 8,349,706 B2 | 1/2013 | Noda |
| 8,377,623 B2 | 2/2013 | Fong |
| 8,380,339 B2 | 2/2013 | Misra et al. |
| 8,393,934 B2 | 3/2013 | Sung |
| 8,398,461 B2 | 3/2013 | Wang |
| 8,398,466 B2 | 3/2013 | Sung et al. |
| 8,409,976 B2 | 4/2013 | Hieslmair |
| 8,444,890 B2 | 5/2013 | Drury |
| 8,545,292 B2 | 10/2013 | Shinchi et al. |
| 8,546,717 B2 | 10/2013 | Stecker |
| 8,562,389 B2 | 10/2013 | Benvegnu et al. |
| 8,598,523 B2 | 12/2013 | Stecker et al. |
| 8,602,851 B2 | 12/2013 | Lombardo et al. |
| 8,647,179 B2 | 2/2014 | Nakayama et al. |
| 8,684,794 B2 | 4/2014 | Lefevre et al. |
| 8,690,978 B2 | 4/2014 | Arnaud et al. |
| 8,702,479 B2 | 4/2014 | Huang et al. |
| 8,709,114 B2 | 4/2014 | Cantrell et al. |
| 8,715,035 B2 | 5/2014 | Roy et al. |
| 8,734,206 B2 | 5/2014 | Chang et al. |
| 8,784,721 B2 | 7/2014 | Philippi et al. |
| 8,801,949 B2 | 8/2014 | Lakrout et al. |
| 8,821,214 B2 | 9/2014 | Joseph |
| 8,845,852 B2 | 9/2014 | Nakamori et al. |
| 8,853,082 B2 | 10/2014 | Hanano et al. |

(56) References Cited

U.S. PATENT DOCUMENTS

| | | | |
|---|---|---|---|
| 8,853,527 B2 | 10/2014 | Hieslmair | |
| 8,864,859 B2 | 10/2014 | Roy et al. | |
| 8,883,392 B2 | 11/2014 | Napadensky et al. | |
| 8,888,480 B2 | 11/2014 | Yoo et al. | |
| 8,894,799 B2 | 11/2014 | Lakrout | |
| 8,932,116 B2 | 1/2015 | Deopura et al. | |
| 8,932,511 B2 | 1/2015 | Napadensky | |
| 8,968,058 B2 | 3/2015 | Kerprich et al. | |
| 8,980,749 B1 | 3/2015 | Itai et al. | |
| 8,986,585 B2 | 3/2015 | Cantrell et al. | |
| 9,017,140 B2 | 4/2015 | Allison et al. | |
| 9,033,764 B2 | 5/2015 | Kitamura et al. | |
| 9,067,297 B2 | 6/2015 | Allison et al. | |
| 9,067,298 B2 | 6/2015 | Lefevre et al. | |
| 9,067,299 B2 | 6/2015 | Bajaj et al. | |
| 9,068,085 B2 | 6/2015 | Kim et al. | |
| 9,089,943 B2 | 7/2015 | Lipson | |
| 9,108,291 B2 | 8/2015 | Lakrout | |
| 9,126,304 B2 | 9/2015 | Kimura | |
| 9,138,858 B2 | 9/2015 | Benvegnu et al. | |
| 9,152,006 B2 | 10/2015 | Farrand et al. | |
| 9,152,340 B2 | 10/2015 | Wu et al. | |
| 9,156,124 B2 | 10/2015 | Allison et al. | |
| 9,162,340 B2 | 10/2015 | Joseph et al. | |
| 9,162,341 B2 | 10/2015 | LeFevre et al. | |
| 9,211,628 B2 | 12/2015 | Allison et al. | |
| 9,216,546 B2 | 12/2015 | DeSimone et al. | |
| 9,254,545 B2 | 2/2016 | Park | |
| 9,259,820 B2 | 2/2016 | Qian et al. | |
| 9,259,821 B2 | 2/2016 | Qian et al. | |
| 9,278,424 B2 | 3/2016 | Roy et al. | |
| 9,296,085 B2 | 3/2016 | Bajaj et al. | |
| 9,308,620 B2 | 4/2016 | Schutte et al. | |
| 9,314,897 B2 | 4/2016 | Qian et al. | |
| 9,333,620 B2 | 5/2016 | Qian et al. | |
| 9,352,443 B2 | 5/2016 | Suen et al. | |
| 9,375,821 B2 | 6/2016 | Chen et al. | |
| 9,375,822 B2 | 6/2016 | Hsu et al. | |
| 9,393,740 B2 | 7/2016 | Okamoto et al. | |
| 9,421,666 B2 | 8/2016 | Krishnan et al. | |
| 9,457,520 B2 | 10/2016 | Bajaj et al. | |
| 9,469,800 B2 | 10/2016 | Jung | |
| 9,481,069 B2 | 11/2016 | Chen et al. | |
| 9,505,952 B2 | 11/2016 | Reiss et al. | |
| 9,587,127 B2 | 3/2017 | Herlihy et al. | |
| 9,630,249 B2 | 4/2017 | Toyserkani et al. | |
| 9,669,512 B2 | 6/2017 | Bajaj et al. | |
| 9,718,129 B2 | 8/2017 | Ljungblad et al. | |
| 9,744,724 B2 | 8/2017 | Bajaj et al. | |
| 9,776,361 B2 | 10/2017 | Krishnan et al. | |
| 9,868,230 B2 | 1/2018 | Dikovsky et al. | |
| 9,873,180 B2 | 1/2018 | Bajaj et al. | |
| 9,950,405 B2 | 4/2018 | Deng | |
| 9,951,054 B2 | 4/2018 | Li et al. | |
| 9,956,314 B2 | 5/2018 | Skaria et al. | |
| 9,993,907 B2 | 6/2018 | Murugesh et al. | |
| 10,005,236 B2 | 6/2018 | Yudovin-Farber et al. | |
| 10,016,877 B2 | 7/2018 | Krishnan et al. | |
| 10,029,405 B2 | 7/2018 | Bajaj et al. | |
| 10,086,500 B2 | 10/2018 | Orilall et al. | |
| 10,220,487 B2 | 3/2019 | Roy et al. | |
| 10,245,704 B2 | 4/2019 | Eilers et al. | |
| 10,322,491 B2 | 6/2019 | Orilall et al. | |
| 10,335,994 B2 | 7/2019 | Napadensky et al. | |
| 10,384,330 B2 | 8/2019 | Bajaj et al. | |
| 10,391,605 B2 | 8/2019 | Ganapathiappan et al. | |
| 10,399,201 B2 | 9/2019 | Ganapathiappan et al. | |
| 10,406,599 B2 | 9/2019 | Ljungblad et al. | |
| 10,406,801 B2 | 9/2019 | Bell et al. | |
| 10,456,886 B2 | 10/2019 | Ganapathiappan et al. | |
| 10,483,235 B2 | 11/2019 | Chiao et al. | |
| 10,493,691 B2 | 12/2019 | Krishnan et al. | |
| 10,537,974 B2 | 1/2020 | Bajaj et al. | |
| 10,593,574 B2 | 3/2020 | Fung et al. | |
| 10,618,141 B2 | 4/2020 | Chockalingam et al. | |
| 10,675,789 B2 | 6/2020 | Dikovsky et al. | |
| 10,744,714 B2 | 8/2020 | Lopez et al. | |
| 10,773,509 B2 | 9/2020 | Ng et al. | |
| 10,821,573 B2 | 11/2020 | Bajaj et al. | |
| 10,875,145 B2 | 12/2020 | Bajaj et al. | |
| 10,875,153 B2 | 12/2020 | Bajaj et al. | |
| 10,876,073 B2 | 12/2020 | Ishida | |
| 10,919,123 B2 | 2/2021 | Hariharan et al. | |
| 10,953,515 B2 | 3/2021 | Ganapathiappan et al. | |
| 2001/0008830 A1 | 7/2001 | Tolles et al. | |
| 2001/0020448 A1 | 9/2001 | Vaartstra et al. | |
| 2001/0029151 A1 | 10/2001 | Chopra | |
| 2001/0034089 A1 | 10/2001 | Yamazaki et al. | |
| 2001/0041511 A1 | 11/2001 | Lack et al. | |
| 2001/0046834 A1 | 11/2001 | Ramana et al. | |
| 2002/0016139 A1 | 2/2002 | Hirokawa et al. | |
| 2002/0058468 A1 | 5/2002 | Eppert et al. | |
| 2002/0069591 A1 | 6/2002 | Yancey | |
| 2002/0077036 A1 | 6/2002 | Roberts et al. | |
| 2002/0083577 A1 | 7/2002 | Suzuki | |
| 2002/0112632 A1 | 8/2002 | Faibish | |
| 2002/0137450 A1 | 9/2002 | Osterheld et al. | |
| 2002/0173248 A1 | 11/2002 | Doan et al. | |
| 2003/0019570 A1 | 1/2003 | Chen et al. | |
| 2003/0022611 A1 | 1/2003 | Bartlett et al. | |
| 2003/0056870 A1 | 3/2003 | Comb et al. | |
| 2003/0113509 A1 | 6/2003 | Lugg | |
| 2003/0134581 A1 | 7/2003 | Wang et al. | |
| 2003/0153253 A1 | 8/2003 | Hanamoto et al. | |
| 2003/0153255 A1 | 8/2003 | Hasegawa et al. | |
| 2003/0166381 A1 | 9/2003 | Lee et al. | |
| 2003/0181137 A1 | 9/2003 | Redeker et al. | |
| 2003/0205325 A1 | 11/2003 | Boyd et al. | |
| 2003/0220061 A1 | 11/2003 | Prasad | |
| 2004/0003895 A1 | 1/2004 | Amano et al. | |
| 2004/0014413 A1 | 1/2004 | Kawahashi et al. | |
| 2004/0033758 A1 | 2/2004 | Wiswesser | |
| 2004/0055223 A1 | 3/2004 | Ono et al. | |
| 2004/0058623 A1 | 3/2004 | Lin et al. | |
| 2004/0092108 A1 | 5/2004 | Yajima et al. | |
| 2004/0106367 A1 | 6/2004 | Walker et al. | |
| 2004/0126575 A1 | 7/2004 | Yoshida et al. | |
| 2004/0133298 A1 | 7/2004 | Toyserkani et al. | |
| 2004/0154533 A1 | 8/2004 | Agarwal et al. | |
| 2004/0171340 A1 | 9/2004 | Prasad | |
| 2004/0173946 A1 | 9/2004 | Pfeifer et al. | |
| 2004/0175451 A1 | 9/2004 | Maekawa et al. | |
| 2004/0180611 A1 | 9/2004 | Tajima et al. | |
| 2004/0187714 A1 | 9/2004 | Napadensky et al. | |
| 2004/0198185 A1 | 10/2004 | Redeker et al. | |
| 2004/0209555 A1 | 10/2004 | Sun et al. | |
| 2004/0224616 A1 | 11/2004 | Shiho et al. | |
| 2004/0266326 A1 | 12/2004 | Shiho et al. | |
| 2005/0003189 A1 | 1/2005 | Bredt et al. | |
| 2005/0016868 A1 | 1/2005 | Basol et al. | |
| 2005/0020082 A1 | 1/2005 | Vishwanathan et al. | |
| 2005/0032464 A1 | 2/2005 | Swisher et al. | |
| 2005/0062900 A1 | 3/2005 | Kim | |
| 2005/0086869 A1 | 4/2005 | Park et al. | |
| 2005/0098540 A1 | 5/2005 | Prasad | |
| 2005/0101228 A1 | 5/2005 | Prasad | |
| 2005/0110853 A1 | 5/2005 | Gardner et al. | |
| 2005/0112998 A1 | 5/2005 | Matsuo et al. | |
| 2005/0124262 A1 | 6/2005 | Manens | |
| 2005/0153634 A1 | 7/2005 | Prasad et al. | |
| 2005/0171224 A1 | 8/2005 | Kulp | |
| 2005/0194681 A1 | 9/2005 | Hu et al. | |
| 2005/0215177 A1 | 9/2005 | Prasad | |
| 2005/0227590 A1 | 10/2005 | Sung | |
| 2005/0250431 A1 | 11/2005 | Shih et al. | |
| 2005/0260928 A1 | 11/2005 | Huh et al. | |
| 2005/0260939 A1 | 11/2005 | Andrews et al. | |
| 2005/0261150 A1 | 11/2005 | Yonker et al. | |
| 2005/0274627 A1 | 12/2005 | Wylie et al. | |
| 2005/0276967 A1 | 12/2005 | Prasad | |
| 2005/0284536 A1 | 12/2005 | Kojima et al. | |
| 2006/0019587 A1 | 1/2006 | Deopura et al. | |
| 2006/0024434 A1 | 2/2006 | Wang et al. | |
| 2006/0052040 A1 | 3/2006 | Prasad | |

(56) References Cited

U.S. PATENT DOCUMENTS

| | | |
|---|---|---|
| 2006/0079159 A1 | 4/2006 | Naujok et al. |
| 2006/0096179 A1 | 5/2006 | Lu et al. |
| 2006/0125133 A1 | 6/2006 | Huh et al. |
| 2006/0160478 A1 | 7/2006 | Donohue et al. |
| 2006/0185256 A1 | 8/2006 | Nevoret et al. |
| 2006/0189269 A1 | 8/2006 | Roy et al. |
| 2006/0192315 A1 | 8/2006 | Farr et al. |
| 2006/0226567 A1 | 10/2006 | James et al. |
| 2006/0252900 A1 | 11/2006 | Bowman et al. |
| 2006/0276109 A1 | 12/2006 | Roy et al. |
| 2007/0007698 A1 | 1/2007 | Sano |
| 2007/0009606 A1 | 1/2007 | Serdy et al. |
| 2007/0032170 A1 | 2/2007 | Halley et al. |
| 2007/0037486 A1 | 2/2007 | Kang et al. |
| 2007/0054599 A1 | 3/2007 | Taylor et al. |
| 2007/0093185 A1 | 4/2007 | Naik |
| 2007/0117393 A1 | 5/2007 | Tregub et al. |
| 2007/0128874 A1 | 6/2007 | Shida et al. |
| 2007/0128991 A1 | 6/2007 | Yoon et al. |
| 2007/0149096 A1 | 6/2007 | Nishimura et al. |
| 2007/0204420 A1 | 9/2007 | Hornby et al. |
| 2007/0212979 A1 | 9/2007 | Preston |
| 2007/0221287 A1 | 9/2007 | Izumoto |
| 2007/0235133 A1 | 10/2007 | Benassi |
| 2007/0235904 A1 | 10/2007 | Saikin |
| 2007/0243795 A1 | 10/2007 | Kobayashi et al. |
| 2007/0269987 A1 | 11/2007 | Nakano et al. |
| 2008/0004743 A1 | 1/2008 | Goers et al. |
| 2008/0009228 A1 | 1/2008 | Nagase et al. |
| 2008/0057845 A1 | 3/2008 | Prasad |
| 2008/0060734 A1 | 3/2008 | Stehle |
| 2008/0105818 A1 | 5/2008 | Cohen |
| 2008/0157436 A1 | 7/2008 | Patel et al. |
| 2008/0207100 A1 | 8/2008 | Roy et al. |
| 2008/0211141 A1 | 9/2008 | Deopura et al. |
| 2008/0220702 A1 | 9/2008 | Feng et al. |
| 2008/0255823 A1 | 10/2008 | Grant |
| 2008/0268760 A1 | 10/2008 | Bajaj et al. |
| 2008/0314878 A1 | 12/2008 | Cai et al. |
| 2009/0011679 A1 | 1/2009 | Bajaj et al. |
| 2009/0053976 A1 | 2/2009 | Roy et al. |
| 2009/0053983 A1 | 2/2009 | Hosaka et al. |
| 2009/0081927 A1 | 3/2009 | Grumbine et al. |
| 2009/0093201 A1 | 4/2009 | Kazuno et al. |
| 2009/0094902 A1 | 4/2009 | Hou |
| 2009/0105363 A1 | 4/2009 | Napadensky |
| 2009/0130956 A1 | 5/2009 | Ohta et al. |
| 2009/0133716 A1 | 5/2009 | Lee |
| 2009/0137121 A1 | 5/2009 | Hsu et al. |
| 2009/0169455 A1 | 7/2009 | Van Aert et al. |
| 2009/0206065 A1 | 8/2009 | Kruth et al. |
| 2009/0253353 A1 | 10/2009 | Ogawa et al. |
| 2009/0270019 A1 | 10/2009 | Bajaj |
| 2009/0308553 A1 | 12/2009 | Souzy et al. |
| 2009/0308739 A1 | 12/2009 | Riker et al. |
| 2009/0311955 A1 | 12/2009 | Kerprich et al. |
| 2009/0320379 A1 | 12/2009 | Jun et al. |
| 2009/0321979 A1 | 12/2009 | Hiraide |
| 2010/0007692 A1 | 1/2010 | Vanmaele et al. |
| 2010/0009612 A1 | 1/2010 | Park et al. |
| 2010/0011672 A1 | 1/2010 | Kincaid et al. |
| 2010/0087128 A1 | 4/2010 | Nakayama et al. |
| 2010/0112919 A1 | 5/2010 | Bonner et al. |
| 2010/0120249 A1 | 5/2010 | Hirose et al. |
| 2010/0120343 A1 | 5/2010 | Kato et al. |
| 2010/0130112 A1 | 5/2010 | Bajaj |
| 2010/0140850 A1 | 6/2010 | Napadensky et al. |
| 2010/0203815 A1 | 8/2010 | Bajaj |
| 2010/0210197 A1 | 8/2010 | Matsumura et al. |
| 2010/0221489 A1 | 9/2010 | Lappalainen et al. |
| 2010/0255254 A1 | 10/2010 | Culler et al. |
| 2010/0323050 A1 | 12/2010 | Kumagai et al. |
| 2011/0011217 A1 | 1/2011 | Kojima |
| 2011/0014858 A1 | 1/2011 | Tsai et al. |
| 2011/0045199 A1 | 2/2011 | Cong |
| 2011/0048772 A1 | 3/2011 | Han |
| 2011/0059247 A1 | 3/2011 | Kuzusako et al. |
| 2011/0077321 A1 | 3/2011 | Napadensky |
| 2011/0130077 A1 | 6/2011 | Litke et al. |
| 2011/0171890 A1 | 7/2011 | Nakayama et al. |
| 2011/0180952 A1 | 7/2011 | Napadensky |
| 2011/0183583 A1 | 7/2011 | Joseph |
| 2011/0204538 A1 | 8/2011 | Drury |
| 2011/0277789 A1 | 11/2011 | Benson |
| 2011/0277877 A1 | 11/2011 | Stehle |
| 2012/0094487 A1 | 4/2012 | Kranz et al. |
| 2012/0178348 A1 | 7/2012 | Hsu et al. |
| 2012/0178845 A1 | 7/2012 | Napadensky et al. |
| 2012/0281334 A1 | 11/2012 | Sasaki et al. |
| 2012/0302148 A1 | 11/2012 | Bajaj et al. |
| 2012/0315830 A1 | 12/2012 | Joseph et al. |
| 2013/0012108 A1 | 1/2013 | Li et al. |
| 2013/0017769 A1 | 1/2013 | Kimura |
| 2013/0019570 A1 | 1/2013 | Weible |
| 2013/0048018 A1 | 2/2013 | Wargo et al. |
| 2013/0052917 A1 | 2/2013 | Park |
| 2013/0055568 A1 | 3/2013 | Dusel et al. |
| 2013/0059506 A1 | 3/2013 | Qian et al. |
| 2013/0059509 A1 | 3/2013 | Deopura et al. |
| 2013/0102231 A1 | 4/2013 | Joseph et al. |
| 2013/0122705 A1 | 5/2013 | Babu et al. |
| 2013/0137350 A1 | 5/2013 | Allison et al. |
| 2013/0139851 A1 | 6/2013 | Sin et al. |
| 2013/0172509 A1 | 7/2013 | Pawloski et al. |
| 2013/0183824 A1 | 7/2013 | Kwon et al. |
| 2013/0212951 A1 | 8/2013 | Ahn et al. |
| 2013/0231032 A1 | 9/2013 | Swedek et al. |
| 2013/0247477 A1 | 9/2013 | Cantrell et al. |
| 2013/0283700 A1 | 10/2013 | Bajaj et al. |
| 2013/0287980 A1 | 10/2013 | Burdzy et al. |
| 2013/0307194 A1 | 11/2013 | Elsey |
| 2013/0309951 A1 | 11/2013 | Benvegnu et al. |
| 2013/0316081 A1 | 11/2013 | Kovalcik et al. |
| 2013/0327977 A1 | 12/2013 | Singh et al. |
| 2013/0328228 A1 | 12/2013 | Pettis et al. |
| 2014/0024216 A1 | 1/2014 | Stender et al. |
| 2014/0034229 A1 | 2/2014 | Xu |
| 2014/0048970 A1 | 2/2014 | Batchelder et al. |
| 2014/0065932 A1 | 3/2014 | Kazuno et al. |
| 2014/0109784 A1 | 4/2014 | Daems et al. |
| 2014/0117575 A1 | 5/2014 | Kemperle et al. |
| 2014/0127973 A1 | 5/2014 | Motoshima et al. |
| 2014/0163717 A1 | 6/2014 | Das et al. |
| 2014/0206268 A1 | 7/2014 | Lefevre et al. |
| 2014/0230170 A1 | 8/2014 | Patel |
| 2014/0239527 A1 | 8/2014 | Lee |
| 2014/0324206 A1 | 10/2014 | Napadensky |
| 2014/0364044 A1 | 12/2014 | Ahn et al. |
| 2014/0370214 A1 | 12/2014 | Araki et al. |
| 2014/0370788 A1 | 12/2014 | Nair |
| 2015/0024233 A1 | 1/2015 | Gunther |
| 2015/0031781 A1 | 1/2015 | Landers et al. |
| 2015/0037601 A1 | 2/2015 | Blackmore |
| 2015/0038066 A1 | 2/2015 | Huang et al. |
| 2015/0043122 A1 | 2/2015 | Eto et al. |
| 2015/0044951 A1 | 2/2015 | Bajaj et al. |
| 2015/0045928 A1 | 2/2015 | Perez et al. |
| 2015/0056421 A1 | 2/2015 | Yudovin-Farber et al. |
| 2015/0056892 A1 | 2/2015 | Vacassy et al. |
| 2015/0056895 A1 | 2/2015 | Fotou et al. |
| 2015/0061170 A1 | 3/2015 | Engel et al. |
| 2015/0065020 A1 | 3/2015 | Roy et al. |
| 2015/0072522 A1 | 3/2015 | Jung |
| 2015/0084238 A1 | 3/2015 | Bonassar et al. |
| 2015/0089881 A1 | 4/2015 | Stevenson et al. |
| 2015/0093977 A1 | 4/2015 | Deopura et al. |
| 2015/0115490 A1 | 4/2015 | Reinarz |
| 2015/0123298 A1 | 5/2015 | Napadensky |
| 2015/0126099 A1 | 5/2015 | Krishnan et al. |
| 2015/0129798 A1 | 5/2015 | Napadensky |
| 2015/0159046 A1 | 6/2015 | Dinega et al. |
| 2015/0174826 A1 | 6/2015 | Murugesh et al. |
| 2015/0216790 A1 | 8/2015 | Feng et al. |
| 2015/0221520 A1 | 8/2015 | Singh et al. |

(56) References Cited

U.S. PATENT DOCUMENTS

| | | |
|---|---|---|
| 2015/0252202 A1 | 9/2015 | Nerad |
| 2015/0375361 A1 | 12/2015 | Qian et al. |
| 2016/0052103 A1 | 2/2016 | Qian et al. |
| 2016/0068996 A1 | 3/2016 | Lau et al. |
| 2016/0101500 A1 | 4/2016 | Fung et al. |
| 2016/0107287 A1 | 4/2016 | Bajaj et al. |
| 2016/0107288 A1 | 4/2016 | Orilall et al. |
| 2016/0107290 A1 | 4/2016 | Bajaj et al. |
| 2016/0107295 A1 | 4/2016 | Bajaj et al. |
| 2016/0107381 A1 | 4/2016 | Krishnan et al. |
| 2016/0114458 A1* | 4/2016 | Bajaj ............... B24B 37/22 51/298 |
| 2016/0136787 A1 | 5/2016 | Bajaj et al. |
| 2016/0176021 A1 | 6/2016 | Orilall et al. |
| 2016/0221145 A1 | 8/2016 | Huang et al. |
| 2016/0229023 A1 | 8/2016 | Ugg et al. |
| 2016/0236279 A1 | 8/2016 | Ashton et al. |
| 2016/0252813 A1 | 9/2016 | Kitson |
| 2016/0257856 A1 | 9/2016 | Reiss et al. |
| 2016/0271869 A1 | 9/2016 | Van De Vrie et al. |
| 2016/0279757 A1 | 9/2016 | Qian et al. |
| 2016/0346997 A1 | 12/2016 | Lewis et al. |
| 2016/0347002 A1 | 12/2016 | Bajaj et al. |
| 2016/0354901 A1 | 12/2016 | Krishnan et al. |
| 2016/0375546 A1 | 12/2016 | Pai et al. |
| 2017/0036320 A1 | 2/2017 | Prasad |
| 2017/0100817 A1 | 4/2017 | Ganapathiappan et al. |
| 2017/0120416 A1 | 5/2017 | Chockalingam et al. |
| 2017/0133252 A1 | 5/2017 | Fung et al. |
| 2017/0136603 A1 | 5/2017 | Ganapathiappan et al. |
| 2017/0148539 A1 | 5/2017 | Prestayko et al. |
| 2017/0151648 A1 | 6/2017 | Huang et al. |
| 2017/0173865 A1 | 6/2017 | Dikovsky et al. |
| 2017/0182629 A1 | 6/2017 | Lehuu et al. |
| 2017/0203406 A1 | 7/2017 | Ganapathiappan et al. |
| 2017/0203408 A1 | 7/2017 | Ganapathiappan et al. |
| 2017/0203409 A1 | 7/2017 | Lefevre et al. |
| 2017/0239886 A1 | 8/2017 | Norikane |
| 2017/0259396 A1 | 9/2017 | Yamamura et al. |
| 2017/0259499 A1 | 9/2017 | Ng et al. |
| 2017/0274498 A1 | 9/2017 | Oh et al. |
| 2018/0043613 A1 | 2/2018 | Krishnan et al. |
| 2018/0100073 A1 | 4/2018 | Chopra et al. |
| 2018/0100074 A1 | 4/2018 | Chopra et al. |
| 2018/0100075 A1 | 4/2018 | Chopra et al. |
| 2018/0158707 A1 | 6/2018 | Hunter et al. |
| 2018/0161954 A1 | 6/2018 | Bajaj et al. |
| 2018/0229343 A1 | 8/2018 | Kim et al. |
| 2018/0236632 A1 | 8/2018 | Murugesh et al. |
| 2018/0339397 A1 | 11/2018 | Redfield |
| 2018/0339402 A1 | 11/2018 | Redfield et al. |
| 2018/0339447 A1 | 11/2018 | Redfield |
| 2018/0340104 A1 | 11/2018 | Hampson et al. |
| 2018/0371276 A1 | 12/2018 | Miyano |
| 2019/0030678 A1 | 1/2019 | Kumar et al. |
| 2019/0039204 A1 | 2/2019 | Chockalingam et al. |
| 2019/0047112 A1 | 2/2019 | Fu et al. |
| 2019/0202024 A1 | 7/2019 | Ganapathiappan et al. |
| 2019/0218697 A1 | 7/2019 | Nakayama et al. |
| 2019/0224809 A1 | 7/2019 | Ganapathiappan et al. |
| 2019/0299357 A1 | 10/2019 | Orilall et al. |
| 2019/0299537 A1 | 10/2019 | McClintock et al. |
| 2019/0337117 A1 | 11/2019 | Ganapathiappan et al. |
| 2020/0001433 A1 | 1/2020 | Bajaj et al. |
| 2020/0055161 A1 | 2/2020 | Chockalingham et al. |
| 2020/0070302 A1 | 3/2020 | Ganapathiappan et al. |
| 2020/0101657 A1 | 4/2020 | Krishnan et al. |
| 2020/0135517 A1 | 4/2020 | Fung et al. |
| 2020/0147750 A1 | 5/2020 | Bajaj et al. |
| 2020/0156311 A1 | 5/2020 | Rolland et al. |
| 2020/0230781 A1 | 7/2020 | Chockalingam et al. |
| 2020/0299834 A1 | 9/2020 | Bajaj et al. |
| 2020/0325353 A1 | 10/2020 | Sridhar et al. |
| 2021/0013014 A1 | 1/2021 | Sarode Vishwanath |
| 2021/0039167 A1 | 2/2021 | Ashton et al. |
| 2021/0107116 A1 | 4/2021 | Bajaj et al. |
| 2021/0187822 A1 | 6/2021 | Yudovin-Farber et al. |
| 2021/0220857 A1 | 7/2021 | Baker et al. |

FOREIGN PATENT DOCUMENTS

| | | |
|---|---|---|
| CN | 1897226 A | 1/2007 |
| CN | 101142055 A | 3/2008 |
| CN | 101428404 A | 5/2009 |
| CN | 101612722 A | 12/2009 |
| CN | 201483382 U | 5/2010 |
| CN | 101642898 B | 9/2011 |
| CN | 202825512 U | 3/2013 |
| CN | 203542340 U | 4/2014 |
| CN | 103465155 B | 5/2016 |
| CN | 106810215 A | 6/2017 |
| DE | 19834559 A1 | 2/2000 |
| EP | 1078717 A3 | 7/2003 |
| EP | 1419876 B1 | 4/2008 |
| EP | 2431157 A1 | 3/2012 |
| GB | 2362592 A | 11/2001 |
| JP | H07102724 B2 | 11/1995 |
| JP | H08132342 A | 5/1996 |
| JP | H11254542 A | 9/1999 |
| JP | H11347761 A | 12/1999 |
| JP | 2000061817 A | 2/2000 |
| JP | 2001018163 A | 1/2001 |
| JP | 200228849 A | 1/2002 |
| JP | 2002151447 A | 5/2002 |
| JP | 3324643 B2 | 9/2002 |
| JP | 2003303793 A | 10/2003 |
| JP | 2004235446 A | 8/2004 |
| JP | 3566430 B2 | 9/2004 |
| JP | 2004243518 A | 9/2004 |
| JP | 2004281685 A | 10/2004 |
| JP | 2005074614 A | 3/2005 |
| JP | 3641956 B2 | 4/2005 |
| JP | 2005-294661 A | 10/2005 |
| JP | 3801100 B2 | 7/2006 |
| JP | 2006231464 A | 9/2006 |
| JP | 2006305650 A | 11/2006 |
| JP | 2007-005612 A | 1/2007 |
| JP | 2007-235001 A | 9/2007 |
| JP | 4077192 B2 | 4/2008 |
| JP | 4512529 B2 | 7/2010 |
| JP | 4693024 B2 | 6/2011 |
| JP | 4798713 B2 | 10/2011 |
| JP | 2013-018056 A | 1/2013 |
| JP | 5143528 B2 | 2/2013 |
| JP | 5226359 B2 | 7/2013 |
| JP | 5248152 B2 | 7/2013 |
| JP | 5697889 B2 | 4/2015 |
| JP | 2016023209 A | 2/2016 |
| JP | 5994183 B2 | 9/2016 |
| JP | 6422325 B2 | 11/2018 |
| JP | 6584895 B2 | 10/2019 |
| KR | 10-2000-0075987 A | 12/2000 |
| KR | 2003-0020658 A | 3/2003 |
| KR | 20100028294 A | 3/2010 |
| KR | 20170071558 A | 6/2017 |
| TW | I222390 B | 10/2004 |
| TW | I279287 B | 4/2007 |
| TW | I432540 B | 4/2014 |
| TW | 201510203 A | 3/2015 |
| WO | 0238688 A3 | 10/2002 |
| WO | 03/103959 A1 | 12/2003 |
| WO | 2006003697 A1 | 1/2006 |
| WO | 2009158665 A1 | 12/2009 |
| WO | 2011/088057 A1 | 7/2011 |
| WO | 2012173885 A3 | 5/2013 |
| WO | 2013162856 A1 | 10/2013 |
| WO | 2014039378 A1 | 3/2014 |

(56) References Cited

FOREIGN PATENT DOCUMENTS

| WO | 2015/111366 A1 | 7/2015 |
|----|----------------|--------|
| WO | 2015120430 A1 | 8/2015 |

OTHER PUBLICATIONS

Plastics in Action; 3-D Printing Speeds Prototype Development dated May/Jun. 1998; 2 total pages.
3D Printing: The Next Industrial Revolution: Christopher Barnatt Publisher: CreateSpace Independent Publishing Platform (May 4, 2013) Language: English, ISBN-10: 148418176X ISBN-13: 978-1484181768.
C. Wong. "Damping Associated with Incipient Melting in Aluminum-Indium Alloys", David Taylor Research Center—SME 89-99. Jan. 1990.
Tammy Hickey et al. "Internal Friction and Modules Studies on Austempered Ductile Iron", Technical Report ARCCB-TR-98001. Jan. 1996. 24 pages.
Rodel. Rodel IC1000 CMP Pad. 1999. 2 pages.
Rajeev Bajaj et al. "Effect of Polishing Pad Material Properties on Chemical Mechanical Polishing (CMP) Processes". 1994. 8 pages.
Rodel. Rodel IC1010. 1998. 2 pages.
Peter Freeman et al. "A Study of the Variation of Physical Properties in Random Lots of Urethane Polishing Pads for CMP". A Rodel Publication. vol. 2, Issue 6. Jun. 1996. 8 Pages.
John J. Aklonis et al. "Introduction to Polymer Viscoelasticity". Second Edition. 1983. 6 pages.
Weidan Li et al. "The Effect of the Polishing Pad Treatments on the Chemical-Mechanical Polishing of SiO2 Films", Thin Solid Films 270 (1995). 6 pages.
Peter Krober et al. "Reactive Inkjet Printing of Polyurethanes", www.rsc.org/materials. Journal of Materials Chemistry. Jan. 6, 2009.
Yu-Lim Jun et al. "Slicing Bitmap Generation and Patterning Technique a SFF System Using UV-Resin", International Conference on Control, Automation and Systems 2007. 5 Pages.
H. Yang. "High Viscosity Jetting System for 3D Reactive Inkjet Printing", Additive Manufacturing and 3D Printing Group, University of Nottingham. 9 pages.
I Hermant et al. "A Comparative Study of Polyurethane-Poly(Methyl Methacrylate) Interpenetrating and Semi-1 Interprenetrating Polymer Networks", vol. 20, No. 1. pp. 85-89, 1984.
Lee M. Cook. "CMP Consumables II: Pad" Chapter 6. Semiconductors and Semimetals, vol. 63. Published 1999. Chemical Mechanical Polishing in Silicon Processing. ISBN: 978-0-12-752172-5.
The DOW Chemical Company—"Specialty Elastomers for Automotive TPO Compounds" brochure, Nov. 2006, 8 pages.
The DOW Chemical Company—"DOW VLDPE DFDB-1085 NT, Very Low Density Polyethylene Resin" Technical Data, UL Prospector, Oct. 2003, 2 pages.
Lubrizol Advanced Materials, Inc.—"Lubrizol Engineered Polymers, Estane 58144 TPU" Technical Data, Feb. 2014, 2 pages.
Sekisui Voltek, LLC—"Volara Type EO" Technical Data, Jan. 2010, 2 pages.
Rogers Corporation, High Performance Foams Division, PORON Microcellular Urethanes—Product Availability Booklet, May 1, 2015, 11 pages.
Epoxy Technology Inc.—"Tech Tip 23: Tg—Glass Transition Temperature for Epoxies" brochure, date unknown, 2 pages.
Wikipedia [online]; 3D Printing; 2013; 17 total pages.
PCT International Search Report and Written Opinion dated Nov. 19, 2018, for International Application No. PCT/US2018/043470.
Chinese Office Action dated Feb. 22, 2021, for Chinese Patent Application No. 201880051442.5.
Byoung-Ho Kwon et al. "Dishing and Erosion in STI CMP". System IC R&D Center, Hyundai Electronics Industries Co. Ltd. 1999 IEEE. 3 pages.
S. Raghavan et al. "Chemical Mechanical Planarization in Integrated Circuit Device Manufacturing". vol. 98-7. 1998. 19 pages.
Van Den Berg, Antje M.J. "Inkjet Printing of Polyurethane Colloidal Suspensions", www.rsc.org/softmatter. Jul. 13, 2006.
Andrews, Rodney J., et al.—"Glass Transition Temperatures of Polymers," Polymer Handbook, Fourth Edition, J. Brandrup et al., Editors, A Wiley Interscience Publication, John Wiley & Sons, Inc., 1999, VI / 193-198.
Crow—"Glass Transition Temperature," webpage, Polymer Properties Database, http://polymerdatabase.com/polymer%20physics/GlassTransition.html, 2015, printed Apr. 10, 2019, 2 pages.
Crow—"Glass Transition Temperatures," webpage, Polymer Properties Database, http://polymerdatabase.com/polymer%20physics/Polymer%20Tg%20C.html, 2015, printed Apr. 10, 2019, 6 pages.
HUPC—"Dipropylene Glycol Diacrylate (DPGDA)" webpage, CAS No. 57472-68-1_Radiation, http://www.union-pigment.com/china/radiation-curable-57472.html, printed Apr. 8, 2019, 2 pages.
Polysciences, Inc.—"Monomers Product Guide," 2012, 16 pages.
Whisnaut, David—"Polymer Chemistry: The Glass Transition" webpage, Engineering Libre Texts, https://eng.libretexts.org/Bookshelves/Materials_Science?Supplemental_Modules_Materia . . . , printed Apr. 10, 2019, 2 pages.
Sigma-Aldrich—"Thermal Transitions of Homopolymers: Glass Transition & Melting Point" webpage, https://www.sigmaaldrich.com/technical-documents/articles/materials-science/polymer-scie . . . , printed Apr. 8, 2019, 3 pages.
Moylan, John—"Considerations for Measuring Glass Transition Temperature," webpage on Element Materials Technology's website, https://www.element.com/nucleus/2017/08/15/18/45/considerations-for-measuring-glass-transition-temperature, Feb. 19, 2019, 8 pages.
ASTM International—"Standard Test Method for Assignment of the Glass Transition Temperature by Dynamic Mechanical Analysis," standard issued under Designation E1640, current edition approved Aug. 1, 2013, 6 pages.
Wikipedia—"Contact angle" webpage, https://en.wikipedia.org/wiki/Contact_angle, last edited Dec. 14, 2019, 9 pages.
ASTM International—"Standard Terminology for Additive Manufacturing Technologies," ASTM Designation: F2792-12a, copyright dated Sep. 9, 2013, pp. 1-3.
Merriam-Webster Dictionary—"Droplet," https://www.merriam-webster.com/dictionary/droplet, accessed Feb. 24, 2020, 8 pages.
Shahrubudin, N., et al.—"An Overview on 3D Printing Technology: Technological, Materials, and Applications," 2nd International Conference on Sustainable Materials Processing and Manufacturing (SMPM 2019), Procedia Manufacturing, 35 (2019), published by Elsevier B.V., pp. 1286-1296.
Wikipedia—"Drop (liquid)," https://en.wikipedia.org/wiki/Drop_(liquid), last edited Feb. 12, 2020, accessed Feb. 24, 2020, 5 pages.
Wikipedia—"Cross-link" webpage at <https://en.wikipedia.org/wiki/Cross-link>, printed Mar. 8, 2019, 8 pages.
J.-G. Park, et al., Post-CMP Cleaning: Interaction between Particles and Surfaces, International Conference on Planarization/CMP Technology, Oct. 25-27, 2007, VDE Verlag CMBH, Berlin-Offenbach, 6 pp.
Pan, GuoShun et al.—"Preparation of silane modified SiO2 abrasive particles and their Chemical Mechanical Polishing (CMP) performances," Wear 273 (2011), pp. 100-104.
Rao, Sunil M., The Effectiveness of Silane and Siloxane Treatments on the Superhydrophobicity and Icephobicity of Concrete Surfaces, RAO, PhD Thesis, 1-118.
A Breakthrough Method for the Effective Conditioning of PVA Brush Used for Post-CMP Process, Lee et al., ECS Journal of Solid State Science and Technology 8, P307-P312 (2019), Published Jun. 5, 2019, 6 pages.
Influence of post-CMP cleaning on Cu interconnects and TDDB reliability, Noguchi et al., IEEE Transactions on Electron Devices 52, 934-941 (2005), Published Apr. 25, 2005, 8 pages.
Arkema, "Liquid Resins for UV Curling", N3XTDIMENSION. Sartomer's Custom Liquid Resin Systems. 3D-arkema.com.
GPS Safety Summary, "Tripropyleneglycol diacrylate", (TPGDA—SR 306)—Mar. 11, 2013.
Shyam Dev Maurya et al. "A Review on Acrylate-Terminated Urethane Oligomers and Polymers: Synthesis and Applications",

(56) References Cited

OTHER PUBLICATIONS

Polymer-Plastics Technology and Engineering. ISSN:0360-2559 (Print) 1525-6111 (Online) Journal homepage: https://www.tandfonline.com/loi/lpte20.
UV/EB Curable Resins. Product Guide—Americas. www.allnex.com.
Office Action for Chinese Application No. 201880051442.5 dated Nov. 2, 2021.
Taiwan Office Action issued to application No. 107125822 dated Jun. 16, 2022.
Chinease Office Action issued to Applicatin No. 201880051442.5 dated Apr. 26, 2022.

\* cited by examiner

INTEGRATED ABRASIVE POLISHING PADS AND MANUFACTURING METHODS

CROSS-REFERENCE TO RELATED APPLICATIONS

This application is a divisional of U.S. patent application Ser. No. 16/042,016, filed duly July 23, 2018, which claims benefit of U.S. Provisional Pat. Appl. No. 62/537,290 filed on Jul. 26, 2017, each of which is herein incorporated by reference in its entirety.

BACKGROUND

Field

Embodiments of the present disclosure generally relate to a polishing pad, and methods of forming a polishing pad, and more particularly, to a polishing pad used for polishing a substrate in an electronic device fabrication process.

Description of the Related Art

Chemical mechanical polishing (CMP) is commonly used in the manufacture of high-density integrated circuits to planarize or polish a layer of material deposited on a substrate, by contacting the material layer to be planarized with a polishing pad and moving the polishing pad and/or the substrate, and hence the material layer surface, in the presence of a polishing fluid and abrasive particles. Two common applications of CMP are planarization of a bulk film, for example pre-metal dielectric (PMD) or interlayer dielectric (ILD) polishing, where underlying features create recesses and protrusions in the layer surface, and shallow trench isolation (STI) and interlayer metal interconnect polishing, where polishing is used to remove the via, contact or trench fill material from the exposed surface (field) of the layer having the feature.

In a typical CMP process, the substrate is retained in a carrier head that presses the backside of the substrate toward the polishing pad. Material is removed across the material layer surface in contact with the polishing pad through a combination of chemical and mechanical activity that is provided by the polishing fluid and the abrasive particles. Typically, the abrasive particles are either suspended in the polishing fluid, known as a slurry, or are embedded in the polishing pad, known as a fixed abrasive polishing pad.

When abrasive particles are suspending in the polish fluid (slurry) a non-abrasive polishing pad is typically used to transport the abrasive particles to the material layer of the substrate where the abrasive particles provide mechanical action, and in some embodiments, chemical reaction, with the surface thereof. In contrast, with a fixed abrasive polishing pad, the abrasive particles are typically integrated into the polishing pad by embedding them in a supporting material (e.g., often referred to as a binder material), such as an epoxy resin. Generally, during a CMP process, the binder material fixedly holds the abrasive particles in place at the polishing pad surface where they provide mechanical polishing action to, and sometimes chemical reaction with, the material layer of the substrate during the CMP process.

Generally, fixed abrasive polishing pads are superior to standard (non-fixed abrasive polishing pads) in some aspects of polishing performance, such as less undesirable erosion of planar surfaces in areas with high feature density and less undesirable dishing of the upper surface of the film material in recessed features such as trenches, contacts, and lines. However, fixed abrasive polishing pads tend to have lower lifetimes (polishes per pad), inferior substrate to substrate stability for film removal rate from the substrate surface, and inferior substrate to substrate stability for uniformity of film removal across the substrate.

Typically, fixed abrasive conditioning disks, such as diamond conditioning disks, are used with standard polishing pads to rejuvenate and planarize the polishing pad surface, and thus maintain substrate to substrate stability polishing performance. However, fixed abrasive conditioning disks are generally incompatible for use with fixed abrasive polishing pads as the disk will remove the embedded abrasive particles from the inherently brittle surface of the supporting epoxy material in which the abrasive material is embedded. This undesirable removal of the abrasive particles leaves a pad surface devoid, or nearly devoid, of the abrasive particles necessary for efficient CMP processes.

Accordingly, what is needed in the art is a polishing pad, and methods of manufacturing a polishing pad, having desirable polishing characteristics of a fixed abrasive polishing pad that is compatible with external conditioning, such as with a fixed abrasive conditioning disk.

SUMMARY

Embodiments herein generally relate to an integrated abrasive (IA) polishing pad comprising abrasive particles disposed in, and chemically bonded to, the polishing material of portions of the polishing pad, and methods of forming thereof. In particular, in embodiments herein, a curable resin precursor mixture is formed with abrasive particles having a polymerizable group chemically bonded to surfaces thereof. The curable resin precursor mixture is used in an additive manufacturing process, along with a curable resin sub-polishing material precursor composition, to form a polishing pad. In some embodiments, the polishing pad has discrete polishing elements with abrasive particles disposed in, and chemically bonded to, the polishing pad material thereof.

In one embodiment, a method of forming a polishing article includes dispensing a first plurality of droplets of a first precursor and curing the first plurality of droplets to form a first layer comprising a portion of a sub-polishing element. The method further includes dispensing a second plurality of droplets of the first precursor and a second precursor onto the first layer and curing the second plurality of droplets to form a second layer comprising portions of the sub-polishing element and portions of a plurality of polishing elements. Here, the second precursor includes functionalized abrasive particles having a polymerizable group chemically bonded to surfaces thereof.

In another embodiment, a method of forming a polishing article includes forming a sub-polishing element from a first plurality of droplets of a first precursor and forming a plurality of polishing elements disposed in, and extending from, the sub-polishing element by dispensing a second plurality of droplets of a second precursor. Here, the second precursor comprises treated metal oxide nanoparticles having polymerizable compounds bonded to less than about 50% of bonding sites on the surface of the metal oxide nanoparticles. The treated metal oxide nanoparticles comprise the reaction product of metal oxide nanoparticles with a silane compound, a cyanate compound, a sulfonic acid compound, a phosphoric acid compound, a carboxylic acid compound, or combinations thereof.

In another embodiment, a polishing article includes a sub-polishing element comprising a first reaction product of a first precursor mixture and a plurality of polishing elements extending from the sub-polishing element. Here, the plurality of polishing elements comprise a second reaction product of a second precursor mixture, wherein the second precursor mixture comprises functionalized abrasive particles.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
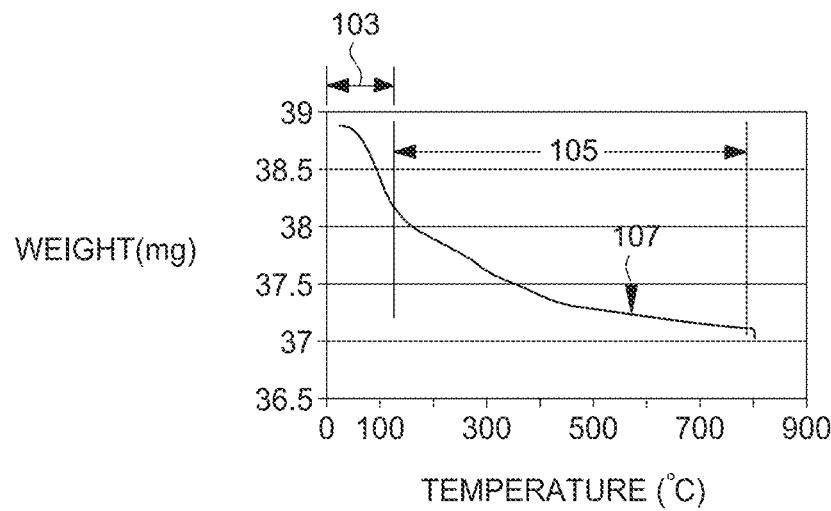
FIGS. 1A-1D illustrate various properties of surface functionalized ceria particles formed according methods set forth herein.

Embodiments described herein generally relate to polishing articles and methods for manufacturing polishing articles used in a polishing process. More specifically, embodiments described herein relate to integrated abrasive (IA) polishing pads, and methods of manufacturing IA polishing pads, that have the advantageous polishing characteristics of fixed abrasive polishing pads yet allow for conditioning with a fixed abrasive conditioner, such as a diamond conditioner. The ability to condition IA polishing pads enables a polishing process that uses a non-abrasive polishing fluid yet has stable and controlled polishing performance and an extended polishing pad lifetime.

Herein the polishing articles described as polishing pads, and methods of forming thereof, are applicable to other polishing applications including, for example, buffing. Further, although the discussion herein is in relation to chemical mechanical polishing (CMP) processes, the articles and methods are also applicable to other polishing processes using both chemically active and chemically inactive polishing fluids. In addition, embodiments described herein may be used in at least the following industries: aerospace, ceramics, hard disk drive (HDD), MEMS and Nano-Tech, metalworking, optics and electro-optics manufacturing, and semiconductor device manufacturing, among others.

Embodiments of the present disclosure provide for integrated abrasive (IA) polishing pads manufactured using, at least in part, surface functionalized abrasive particles in an additive manufacturing process, such as a two-dimensional 2D or three-dimensional 3D inkjet printing process. Additive manufacturing processes, such as the three-dimensional printing ("3D printing") process described herein, enable the formation of polymer IA polishing pads with discrete polishing regions and/or polishing features (polishing elements) having unique properties and attributes. Generally, the polymers of the polishing elements form chemical bonds, for example covalent bonds or ionic bonds, with the polymers of adjacent polishing elements at the interfaces thereof. Because the polishing elements are linked with adjacent polishing elements through chemical bonding, the interfaces are stronger and more robust than polishing pads having discrete elements attached using other methods, such as with adhesive layers or by thermal bonding, to allow for the use of a more aggressive polishing or conditioning process when desired.

Herein, abrasive particles refer to hydroxyl terminated metal oxide nanoparticles such as single or multicomponent metal oxide nanoparticles, for example ceria, alumina, silica, silica/alumina oxide, or combinations thereof. In other embodiments, the abrasive particles comprise metal oxide nanoparticles terminated with hydroxyl groups, thiol groups, carboxylic acid groups, amino groups, or combinations thereof. A surface functionalized abrasive particle refers to an abrasive particle comprising at least one polymerizable group chemically bonded to bonding sites on the surfaces thereof. Bonding sites refers to sites that can react with the compounds described herein to form a covalent bond with a polymerizable group.

In some embodiments, surface modification to achieve the surface functionalized abrasive particle includes reacting the surfaces of the hydroxyl terminated abrasive particles with surface modifying organic compounds, such as organic silane compounds, sulfonic acid compounds, organic phosphoric acid compounds, carboxylic acid compounds, derivatives thereof, or combinations thereof. In embodiments described herein, the reaction product of the hydroxyl terminated abrasive particles comprises abrasive particles having surfaces terminated with both alkene and hydroxyl groups, hereafter referred to as alkene terminated abrasive particles. In other embodiments, the surfaces may be terminated with any polymerizable group, such as an epoxy group, for example an epoxy aldehyde group or an epoxy ketone group.

In one embodiment, the surface functionalized abrasive particles are formed by reacting the surfaces of the abrasive particles with a silane compound, such as an alkoxy silane, such as trichloro(phenyl)silane, trichloro(hexyl)silane, trichloro(octadecyl)silane, trimethoxy(7-octen-1-yl)silane, trichloro[2-(chloromethyl)allyl]silane, vinyltrimethoxysilane, chloro(dimethyl)vinylsilane, allyltrimethoxysilane, acryloyl chloride, vinyltrimethoxysilane, or combinations thereof. The abrasive particle silane compound reaction is used to graft a desired polymerizable group onto a hydroxyl terminated surface of the abrasive particle (i.e., circular shaped element shown below) as represented in chemical reactions (A) and (B) where R is a methyl group (CH$_3$).

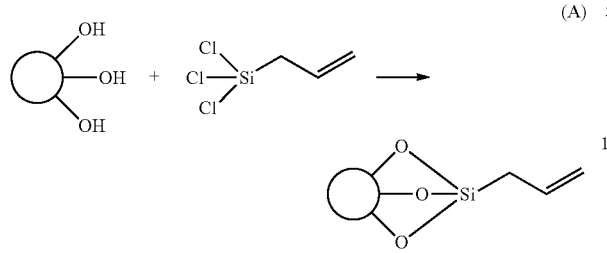

In another embodiment, the surface functionalized abrasive particles are formed by reacting the surfaces of the abrasive particles with a cyanate compound, such as an isocyanate based monomer such as tris-[3-(trimethoxysilyl) propyl]isocyanurate or 2-(methacryloyloxy)ethyl isocyanate. For example, the isocyanate group of 2-(methacryloyloxy)ethyl isocyanate reacts with hydroxyl group and form amide bond results in covalent linkage of acrylic groups with abrasive nanoparticles as shown in chemical reaction (C) where R represents hydrogen (H) or a methyl group (CH$_3$).

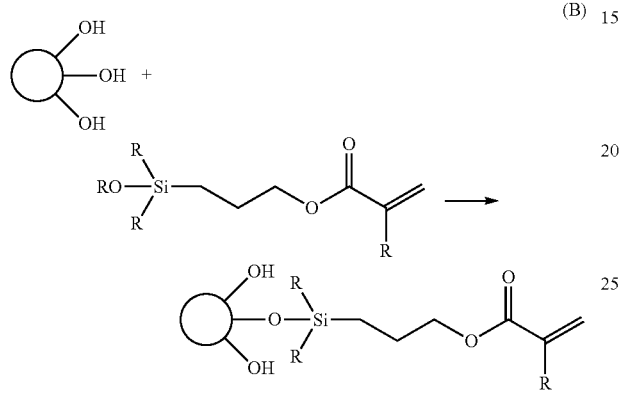

In another embodiment, the surface functionalized abrasive particles are formed by reacting the surfaces of the abrasive particles with sulfonic or phosphoric acid derivatives, such as 2-acrylamido-2-methyl-1-propanesulfonic acid as shown in reaction (D) or with vinyl phosphonate as shown in reaction (E), where R represents hydrogen (H) or a methyl group (CH$_3$).

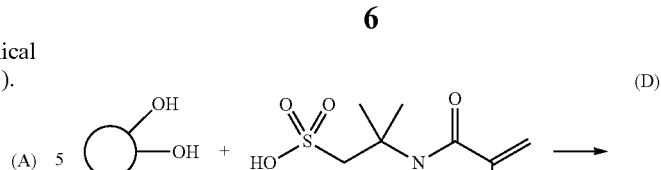

In another embodiment, the surface functionalized abrasive particles are formed by reacting the surfaces of the abrasive particles with carboxylic acids that comprise acrylic groups, such as shown in chemical reaction (F) where R represents hydrogen (H) or a methyl group (CH$_3$) and n is from 1 to 50. In some embodiments, the reactivity of the carboxylic group is increased by converting the carboxylic acid containing acrylic group to a chloride acid using thionyl chloride.

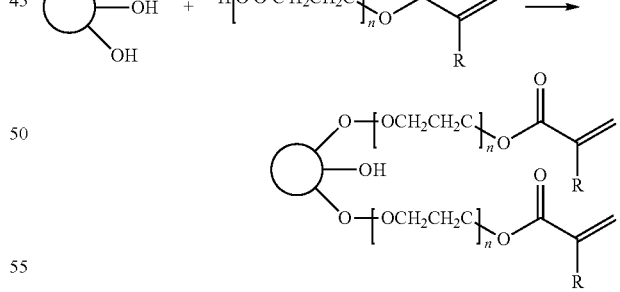

FIGS. 1A-1D illustrate various properties of surface functionalized ceria particles formed according to one embodiment. Ceria is commonly used as an abrasive particle for shallow trench isolation (STI) polishing applications in addition to other CMP applications because the hydroxyl terminated surface of ceria exhibits a high affinity for silicon oxide (SiO$_2$) materials compared to silicon nitride materials leading to desirably high selectivity between the two films. While not wishing to be bound by a particular theory it is believed that excessive loading (% of bonding sites) of the surface of ceria particles with polymerizable groups will undesirably influence the reaction of the ceria particle with an H-terminated surface of SiO$_2$ which impacts polishing rate and selectivity performance. Therefore, it is desirable to limit the loading of functionalized surface sites on the surfaces of the ceria particles so that sufficient hydroxyl terminated sites remain to react with the H-terminated surfaces of SiO$_2$. Herein, loading of the abrasive particles surfaces, such as ceria surfaces, with polymerizable groups is desirably maintained at between about 0.1% and about 50%, such as between about 1% and about 25%, such as between about 1% and about 10%, such as between about 1% and about 5%, for example between about 2% and about 5%, or where at least some of the abrasive particle surfaces are surface functionalized by not more than about 5%.

In FIGS. 1A-1D ceria particles were surface functionalized by reacting the hydroxyl terminated surface sites with chloro(dimethyl)vinylsilane as shown in reaction (G).

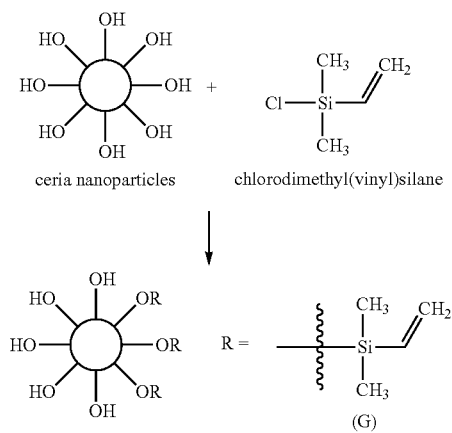

The reaction was carried out by mixing ceria particles with a non-aqueous solvent, such as toluene, while using a probe sonicator to agitate the mixture at 60° C. Chloro (dimethyl)vinylsilane was added to the mixture drop by drop during sonication and the mixture was then maintained at 60° C. for about three hours to complete the reaction and provide for surface functionalized ceria particles. The surface functionalized ceria particles were purified by a combination of filtration, centrifugation, and washing with toluene to remove the unreacted chloro(dimethyl)vinylsilane. The treated ceria particles were characterized with thermogravimetric analysis (TGA), Fourier transform infrared spectroscopy (FTIR), transmission electron microscopy (TEM), and energy dispersive x-ray (EDX) analysis to confirm functionalization thereof.

Figure 1B:
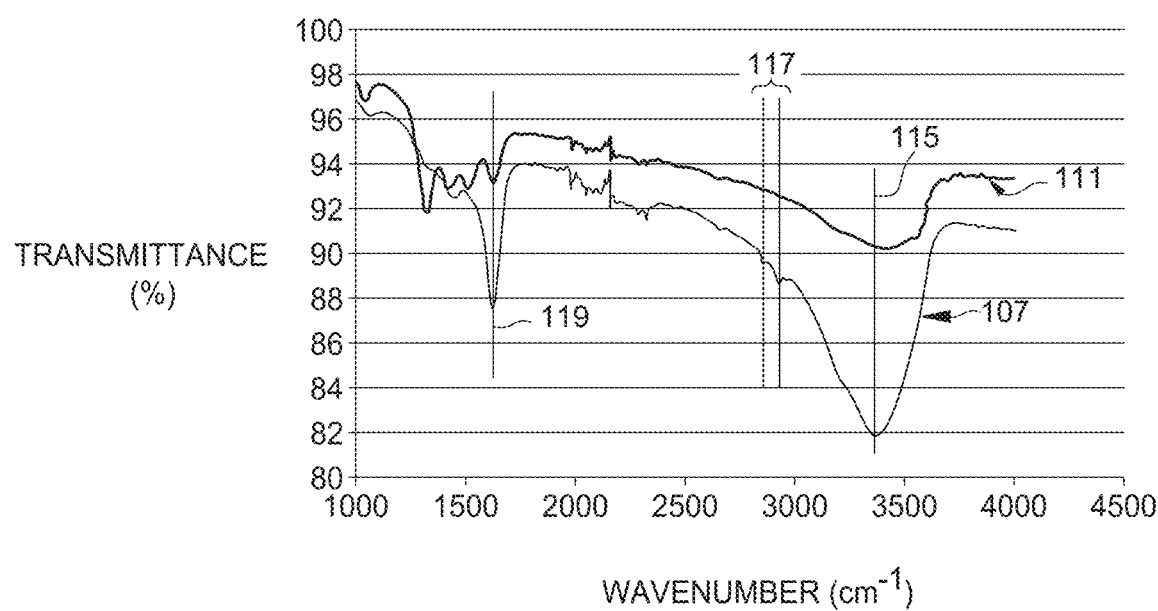

FIG. 1A shows the results of a thermogravimetric analysis (TGA) of a sample of the treated ceria particles. As the sample of treated ceria particles 107 was heated from ambient temperature to 100° C. (first range 103) it experienced rapid weight loss attributable to the evaporation of the residual toluene left from the purification process. A second range 105 of temperatures from 100° C. to 800° C., and, in particular, from 400° C. to 800° C. show a more gradual decline in the weight of the sample of treated ceria particles which is attributable to the ignition of the hydrocarbons of the polymerizable groups bonded to the bonding sites on the surfaces thereof. FIG. 1B shows the results of an FTIR analysis of the treated ceria particles 107 compared to untreated ceria particles 111. A CH=CH$_2$ vibration 119 at a wavelength of about 1620 cm$^{-1}$ and methyl antisymmetric and symmetric vibrations 117 at about 2919 cm$^{-1}$ and 2850 cm$^{-1}$ indicate successful surface modification, and thus surface functionalization, of the treated ceria particles 107 with dimethyl vinyl silane groups when compared to the untreated ceria particles 111. An O—H vibration 115 at about 3400 cm$^{-1}$ indicates that a portion of the hydroxyl groups on the treated ceria particles 107 have been consumed during the reaction when compared to the untreated ceria particles 111, further indicating successful surface functionalization of the treated ceria particles 107 with dimethyl vinyl silane groups. However, as shown by O—H vibration 115 at least a portion of the hydroxyl groups remain bonded to bonding sites of the surfaces of the treated ceria particles 107 thus leaving sufficient hydroxyl terminated sites on the ceria particle maintain desirable polishing rates and/or selectivity performance during a CMP process, such as during an STI polishing process where the hydroxyl terminated sites of ceria particles react with H-terminated surfaces of SiO$_2$.

Figure 1C:
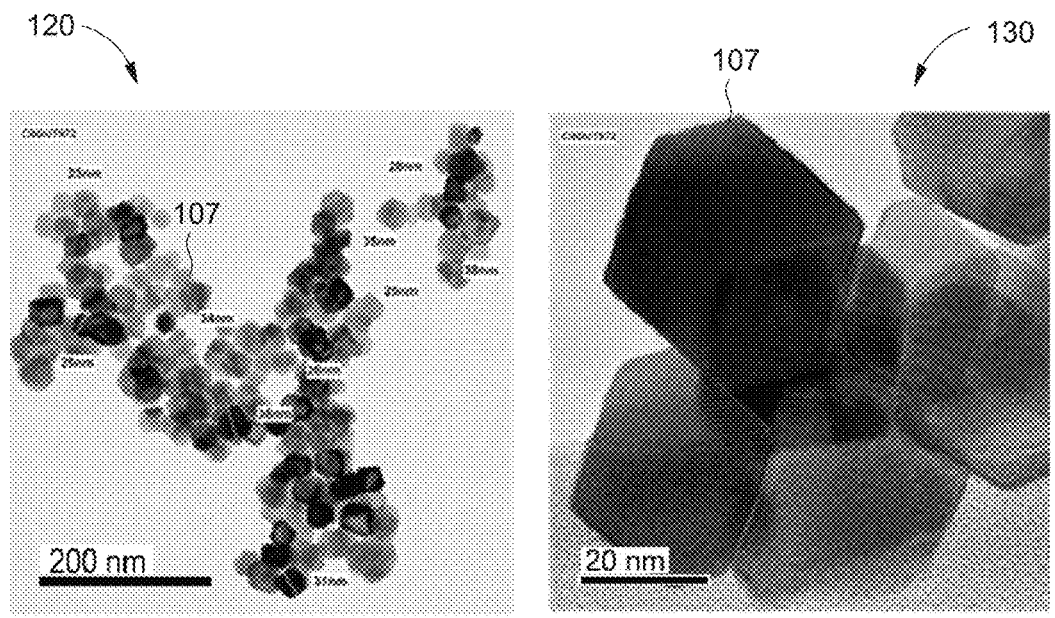
Figure 1D:
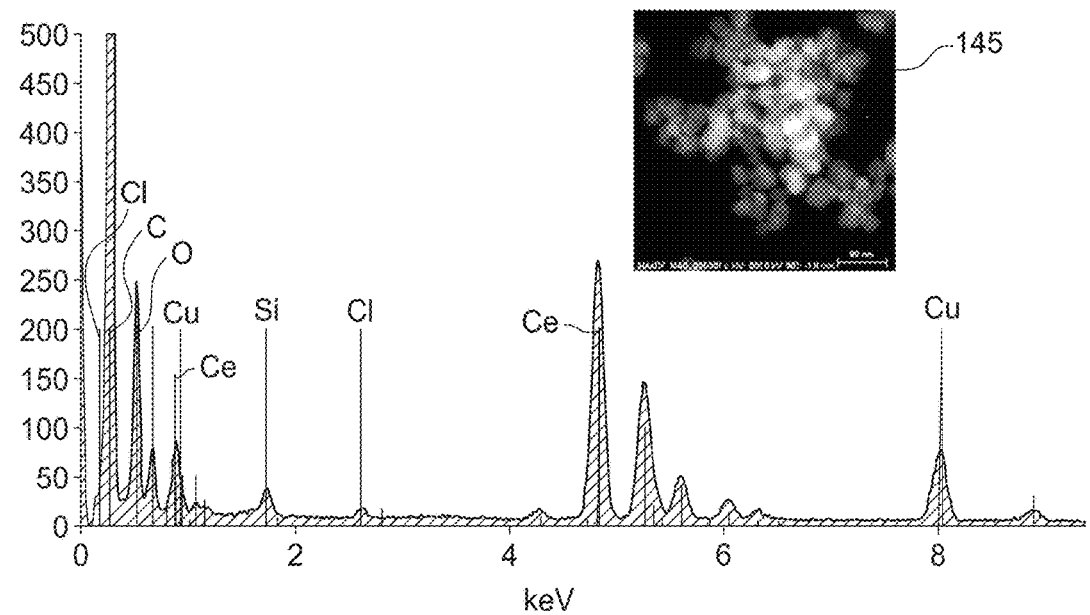

FIG. 1C shows TEM images 120 and 130 where drop-coated films of the treated ceria particles 107 were formed on carbon-coated copper grinds by solvent evaporation. As shown in images 120 and 130 the individual treated ceria particles have a fairly uniform mean diameter of between about 20 nm to about 50 nm. However, not unexpectedly, the individual particles formed larger agglomerations of particles that, in a typical formulation, will need to be milled, meaning the larger agglomerations of particles will need to be separated into smaller agglomerations and/or individual particles before or during formulation of the precursor mixtures used to form the IA polishing pad described herein. FIG. 1D shows selected EDX spectra of the treated ceria particles shown in image 145, where Ce, O, and Si signals are attributable to ceria particles and the bonded dimethyl vinyl silane group, indicating successful functionalization of the treated ceria particles' surfaces with the polymerizable dimethyl vinyl silane group. In another embodiment, the surfaces of the abrasive particles are reacted with the surface modifying compounds using a vapor reaction process, such as a fluidized bed.

Figure 2A:
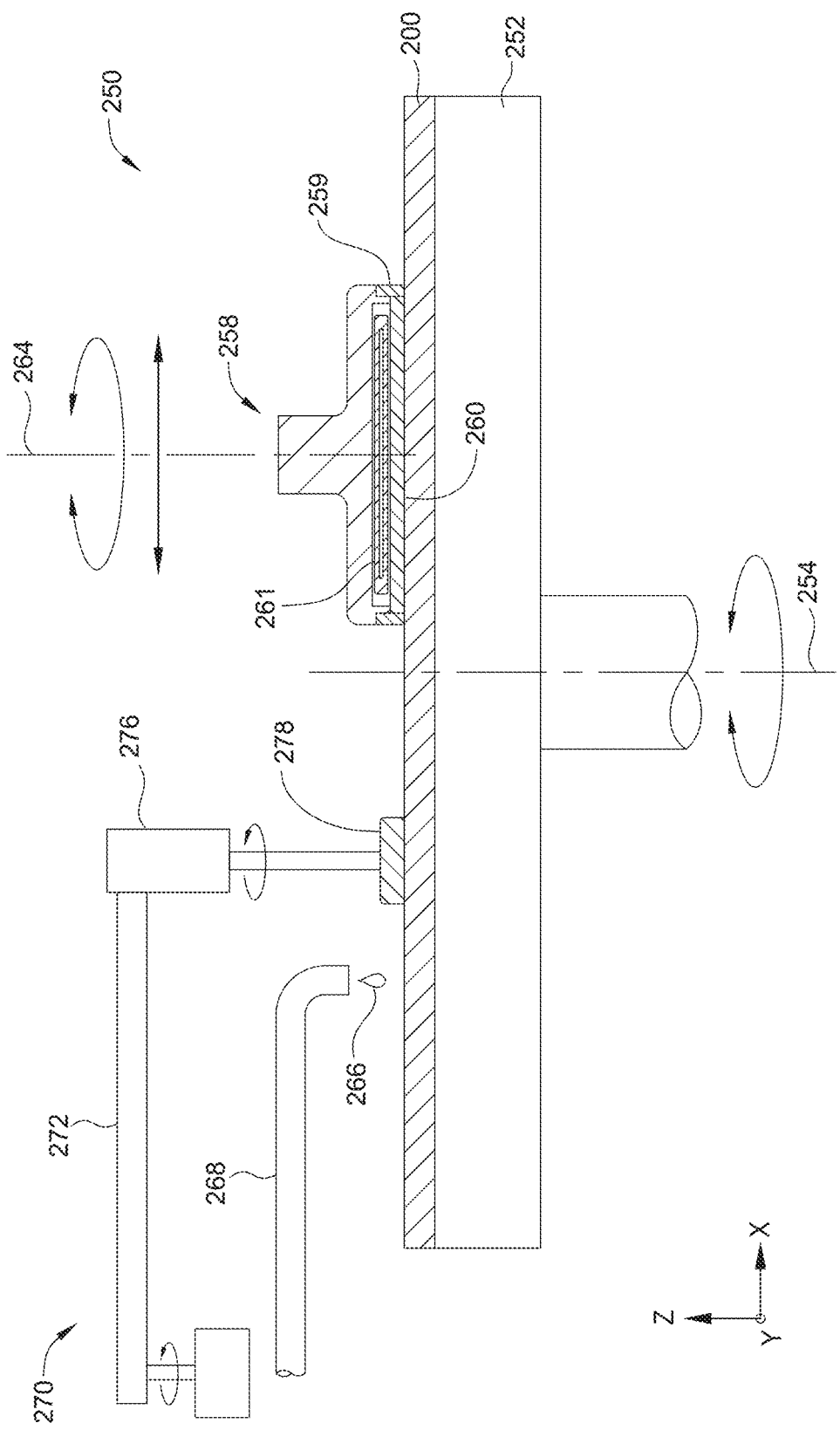
FIG. 2A is a schematic sectional view of a polishing system using an integrated abrasive (IA) polishing pad formed according to embodiments disclosed herein.

FIG. 2A is a schematic sectional view of an example polishing system 250 using an IA polishing pad 200 formed according to the embodiments described herein. Typically, the IA polishing pad 200 is secured to a platen 252 of the polishing system 250 using an adhesive, such as a pressure sensitive adhesive, disposed between the IA polishing pad 200 and the platen 252. A substrate carrier 258, facing the platen 252, and the IA polishing pad 200 mounted thereon, has a flexible diaphragm 261 configured to impose different pressures against different regions of a substrate 260 while urging the material surface of the substrate 260 against the polishing surface of the IA polishing pad 200. The substrate carrier 258 includes a carrier ring 259 surrounding the substrate 260. During polishing, a downforce on the carrier ring 259 urges the carrier ring 259 against the IA polishing pad 200 to prevent the substrate 260 from slipping from the substrate carrier 258. The substrate carrier 258 rotates about a carrier axis 264 while the flexible diaphragm 261 urges the substrate 260 against the polishing surface of the IA polishing pad 200. The platen 252 rotates about a platen axis 254 in an opposite direction from the rotation of the substrate carrier 258 while the substrate carrier 258 sweeps back and forth from an inner diameter of the platen 252 to an outer diameter of the platen 252 to, in part, reduce uneven wear of the IA polishing pad 200. Herein, the platen 252 and the IA polishing pad 200 have a surface area that is greater than a surface area of the substrate 260, however, in some polishing systems, the IA polishing pad 200 has a surface area that is less than the surface area of the substrate 260.

During polishing, a fluid 226 is introduced to the IA polishing pad 200 through a fluid dispenser 268 positioned over the platen 252. Typically, the fluid 226 is water, a polishing fluid, a polishing slurry, a cleaning fluid, or a combination thereof. Herein, the polishing fluid contains a pH adjuster and/or chemically active components, such as an oxidizing agent, to enable chemical mechanical polishing of the material surface of the substrate 260.

Typically, the polishing system 250 includes a pad conditioning assembly 270 that comprises a conditioner 278, such as a fixed abrasive conditioner, for example a diamond conditioner. The conditioner 278 is coupled to a conditioning arm 272 having an actuator 276 that rotates the conditioner 278 about its center axis. while a downforce is applied to the conditioner 278 as it sweeps across the IA polishing pad 200 before, during, and/or after polishing the substrate 260. The conditioner 278 abrades and rejuvenates the IA polishing pad 200 and/or cleans the IA polishing pad 200 by removing polish byproducts or other debris from the polishing surface thereof.

Figure 2B:
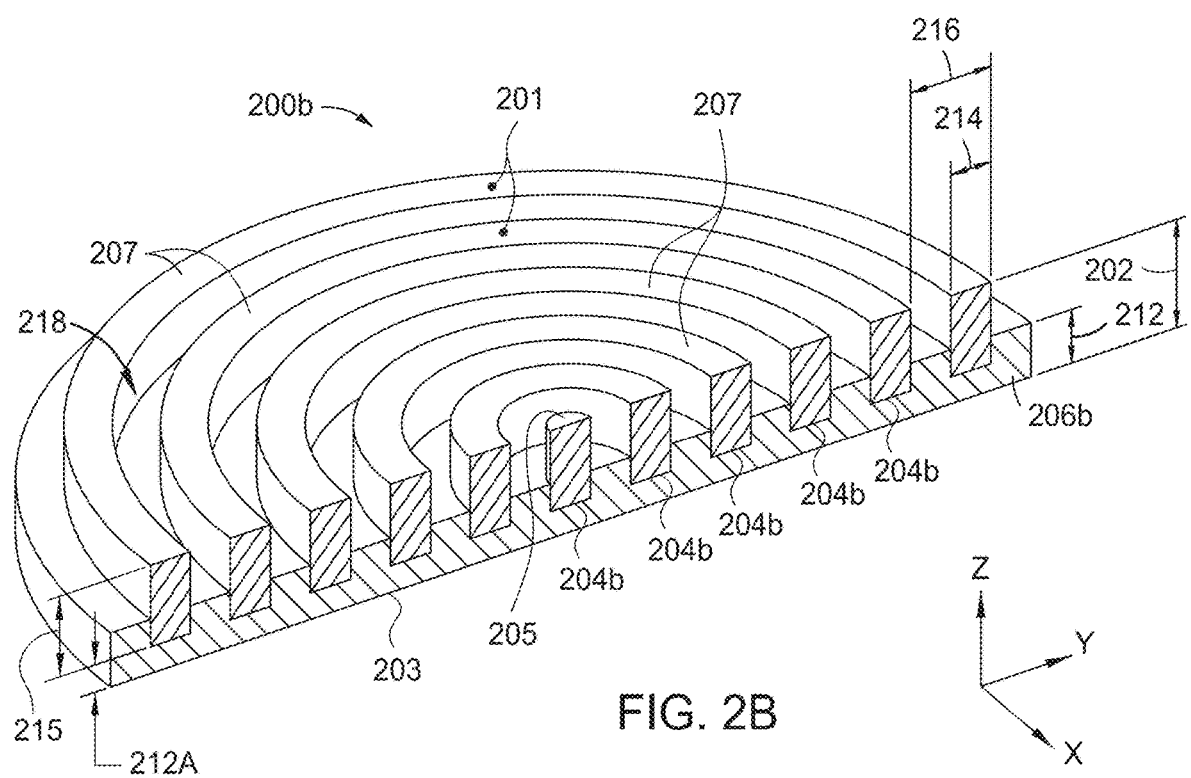
FIGS. 2B-2C are schematic perspective sectional views of IA polishing pads, according to embodiments described herein.
Figure 2C:
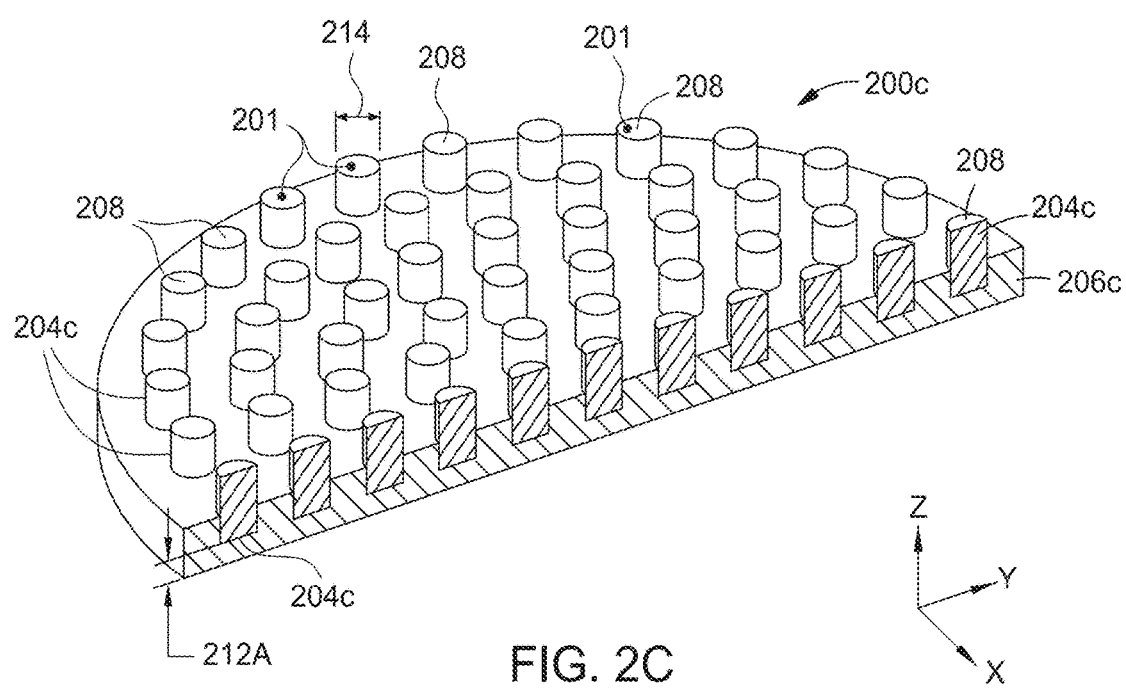

FIGS. 2B-2C are schematic perspective sectional views of IA polishing pads 200b-c, according to embodiments described herein. The IA polishing pads 200b-c can be used as the IA polishing pad 200 in the polishing system 250 of FIG. 2A. In FIG. 2B, the IA polishing pad 200b comprises a plurality of polishing elements 204b that are disposed within a sub-polishing element 206b, and extend from a surface of the sub-polishing element 206b. The plurality of polishing elements 204b have a thickness 215 the sub-polishing element 206b has a sub-thickness 212. As illustrated in FIGS. 2B and 2C, the polishing elements 204b, 204c are supported by a portion of the sub-polishing element 206b, 206c (e.g., portion within region 212A). Therefore, when a load is applied to the polishing surface 201 of the IA polishing pads 200b-c (e.g., top surface) by a substrate during processing, the load will be transmitted through the polishing elements 204b, 204c and portion 212A of the sub-polishing element 206b, 206c. Herein, the plurality of polishing elements 204b include a post 205 disposed in the center of the IA polishing pad 200b and a plurality of concentric rings 207 disposed about the post 205 and extending radially outward therefrom. The plurality of polishing elements 204b and the sub-polishing element 206b define a plurality of channels 218 disposed in the IA polishing pad 200b between each of the polishing elements 204b and between a plane of the polishing surface of the IA polishing pad 200b and a surface of the sub-polishing element 206b. The plurality of channels 218 enable the distribution of fluid 266, such as a polishing fluid, across the IA polishing pad 200b and to an interface between the IA polishing pad 200b and the material surface of a substrate 260. In other embodiments, the patterns of the polishing elements 204b are rectangular, spiral, fractal, random, another pattern, or combinations thereof. Herein, a width 214 of the polishing element(s) 204b-c is between about 250 microns and about 5 millimeters, such as between about 250 microns and about 2 millimeters. A pitch 216 between the polishing element(s) 204b is between about 0.5 millimeters and about 5 millimeters. In some embodiments, the width 214 and/or the pitch 216 varies across a radius of the IA polishing pad 200b to define zones of pad material properties and/or abrasive particle concentration.

In FIG. 2C, the polishing elements 204c are shown as circular columns extending from the sub-polishing element 206c. In other embodiments, the polishing elements 204b are of any suitable cross-sectional shape, for example columns with toroidal, partial toroidal (e.g., arc), oval, square, rectangular, triangular, polygonal, irregular shapes, or combinations thereof. In some embodiments, the shapes and widths 214 of the polishing elements 204c, and the distances therebetween, are varied across the IA polishing pad 200c to tune hardness, mechanical strength, fluid transport characteristics, or other desirable properties of the complete IA polishing pad 200c.

Herein, the polishing elements 204b-c and the sub-polishing elements 206b-c each comprise a pad material composition of at least one of oligomeric and/or polymeric segments, compounds, or materials selected from the group consisting of: polyamides, polycarbonates, polyesters, polyether ketones, polyethers, polyoxymethylenes, polyether sulfone, polyetherimides, polyimides, polyolefins, polysiloxanes, polysulfones, polyphenylenes, polyphenylene sulfides, polyurethanes, polystyrene, polyacrylonitriles, polyacrylates, polymethylmethacrylates, polyurethane acrylates, polyester acrylates, polyether acrylates, epoxy acrylates, polycarbonates, polyesters, melamines, polysulfones, polyvinyl materials, acrylonitrile butadiene styrene (ABS), halogenated polymers, block copolymers and random copolymers thereof, and combinations thereof.

In some embodiments, the materials used to form portions of the IA polishing pad 200b-c, such as the first polishing elements 204b-c and the sub-polishing elements 206b-c will include the reaction product of at least one ink jettable pre-polymer composition that is a mixture of functional polymers, functional oligomers, reactive diluents, and curing agents to achieve the desired properties of an IA polishing pad 200b-c. In general, the deposited material can be exposed to heat or electromagnetic radiation, which may include ultraviolet radiation (UV), gamma radiation, X-ray radiation, visible radiation, IR radiation, and microwave radiation and also accelerated electrons and ion beams may be used to initiate polymerization reactions. For the purposes of this disclosure, we do not restrict the method of cure, or the use of additives to aid the polymerization, such as sensitizers, initiators, and/or curing agents, such as through cure agents or oxygen inhibitors. In one embodiment, two or more polishing elements, such as the polishing elements 204b-c and the sub-polishing elements 206b-c, within a unitary pad body, are formed from the sequential deposition and post deposition processing and comprise the reaction product of at least one radiation curable resin precursor composition, wherein the compositions contain functional polymers, functional oligomers, monomers, and/or reactive diluents that have unsaturated chemical moieties or groups, including but not restricted to: vinyl groups, acrylic groups, methacrylic groups, allyl groups, and acetylene groups. The hardness and/or storage modulus E' of the materials found within the polishing elements 204b-c and the sub-polishing elements 206b-c are different, such that the values hardness and/or storage modulus E' values for the polishing elements 204b-c elements are greater than the sub-polishing elements 206b-c elements. In some embodiments, the material composition and/or material properties of the polishing elements 204b-c vary from polishing element to polishing element. Individualized material composition and/or material properties allow for the tailoring of the polishing pads for specific needs.

At least a portion of the one or more of the plurality of polishing elements 204b-c include abrasive particles disposed in, and chemically bonded, either covalently or ionically, to the polishing pad material compositions thereof.

Herein, the polishing elements 204b-c comprise, at least, the reaction product of a radiation curable resin precursor composition that contains functional polymers, functional oligomers, monomers, or reactive diluents that have unsaturated chemical moieties or groups, including but not restricted to: vinyl groups, acrylic groups, methacrylic groups, allyl groups, and acetylene groups, and surface functionalized abrasive particles, such as alkene terminated abrasive particles, for example alkene terminated metal oxide nanoparticles. Typically, the concentration of the abrasive particles is less than about 70 wt. % of the polishing pad material composition of the polishing element 204b, such as less than about 50 wt. %, such as between about 1 wt. % and about 50 wt. %, between about 1 wt. % and about 40 wt. %, between about 1 wt. % and about 30 wt. %, between about 1 wt. % and about 20 wt. %, between about 1 wt. % and about 10 wt. %, for example between about 1 wt. % and about 5 wt. %. Herein, the surface functionalized abrasive particles are uniformly distributed throughout the polishing elements 204b-c.

In other embodiments, the surface functionalized abrasive particles are uniformly distributed in the portion of the polishing elements 204b-c extending from the surface of the sub-polishing elements 206b-c and abrasive particles are not included in the polishing pad material in the portion of the polishing element 204b-c extending beneath the surface of the sub-polishing element 206b-c. In other embodiments, the concentration of the abrasive particles increases or decreased from first ends of the polishing elements 204b-c to second ends of the polishing elements 204b-c distal from the first ends where the second ends form polishing surfaces of the IA polishing pads 200b-c. In other embodiments, the abrasive particles are disposed in abrasive layers of the polishing elements with layers of pad material (non-abrasive layers) comprising no abrasive particles, or lower concentrations of abrasive particles, disposed therebetween. In some embodiments, the IA polishing pads 200b-c further include abrasive particles disposed in, and chemically bonded to, the polishing pad material compositions of the sub-polishing elements 206b-c.

Typical polishing pad material composition properties that may be adjusted using the methods and material compositions described herein include storage modulus E', loss modulus E", hardness, tan δ, yield strength, ultimate tensile strength, elongation, thermal conductivity, zeta potential, mass density, surface tension, Poison's ratio, fracture toughness, surface roughness ($R_a$), glass transition temperature (Tg) and other related properties. For example, storage modulus E', influences polishing results such as the removal rate from, and the resulting uniformity of, the material layer surface of a substrate. Typically, polishing pad material compositions having a medium or high storage modulus E' provide a higher removal rate for dielectric films used for PMD, ILD, and STI, and cause less undesirable dishing of the upper surface of the film material in recessed features such as trenches, contacts, and lines. Polishing pad material compositions having a low storage modulus E' generally provide more stable removal rates across the polishing pad lifetime, cause less undesirable erosion of a planer surface in areas with high feature density, and cause reduced micro scratching of the material surface. In general, polishing pad material compositions with a low storage modulus are unsuitable as a binder material for the abrasive particles of a conventional fixed abrasive polishing pad as the abrasive particles can more easily escape the softer pad material than with a hard, high storage modulus E', conventional epoxy resin type of supporting material. Characterizations as a low, medium, or high storage modulus E' pad material composition at temperatures of 30° C. (E'30) and 90° C. (E'90) are summarized in Table 1:

TABLE 1

| | Low Storage Modulus Compositions | Medium Modulus Compositions | High Modulus Compositions |
|---|---|---|---|
| E'30 | 5 MPa-100 MPa | 100 MPa-500 MPa | 500 MPa-3000 MPa |
| E'90 | <17 MPa | <83 MPa | <500 MPa |

Typically, the sub-polishing elements 206b-c are formed from materials different from the materials forming the polishing elements 204b-c, such as materials having a low (soft) or moderate storage modulus E'. The polishing elements 204b-c are typically formed from materials having a medium or high (hard) storage modulus E'. With a standard non-abrasive polishing pad and slurry process, medium or high storage modulus polishing materials are generally necessary to maintain desirable material removal rates when polishing dielectric materials, such as $SiO_2$. This is because the harder pad materials more effectively hold or support the loose abrasive particles against the material surface of the substrate when compared to a softer pad that will allow the abrasive particles to sink below the pad surface as the pad material deforms when a downforce pushes the substrate against the surface of the polishing pad. Also, it has been found that CMP processes that use soft or low storage modulus E' polishing pads tend to have non-uniform planarization results due to the relative ease that a soft or low storage modulus E' polishing pad deforms under the applied force generated by the carrier ring 259 (FIG. 2A) and the applied force generated by the flexible diaphragm 261 during a CMP process. In other words, the soft, flexible and low storage modulus E' nature of the material used to form the soft or low storage modulus E' polishing pad allows the effect that the force, supplied by the carrier ring 259, to be minimized, which improves the ability of the pad to compensate for carrier ring downforce. Likewise, conventional fixed abrasive polishing pads typically utilize a material that has a high hardness value to physically hold the abrasive particles in place. However, it has been found that CMP processes that use "hard" polishing pad materials tend to have non-uniform planarization results due to edge effects found at the edge of the polished substrate 260 (FIG. 2A) that specifically relate to the need to apply a force to the carrier ring 259 (FIG. 2A) to compensate for a larger inherent polishing non-uniformity found at the edge of the substrate during a CMP process. It is believed that one of the benefits of the IA polishing pads described herein is the ability to maintain high removal rates and low erosion where the polishing elements 204b-c comprise a polishing pad material composition having a tuned and/or controlled low or medium storage modulus E'. This is because the desirably positioned abrasive particles, will be held at the pad surface, through covalent bonding thereto, instead of sinking into the soft pad material as with a standard soft polishing pads and slurry process. By holding the abrasive particles at the polishing surface of a soft pad material, the chemical activity between the abrasive particle and the material surface of the substrate, such as a between a ceria particle and an $SiO_2$ substrate surface, can be maintained to enable a reasonable material removal rate. Therefore, in some embodiments the polishing elements 204b-c will have a low or medium storage modulus E'. However, it is also recognized that surface functionalized abrasive particles act as a crosslinking reagent between polymer chains formed from the radiation curable resin precursor composition. In some embodiments, this function as a crosslinking reagent will lead to a higher storage modulus E' for the polishing elements 204b-c, depending on the loading of the polymerizable terminated bonding sites, such as alkene terminated bonding sites, on the abrasive particle and/or the concentration of the surface functionalized abrasive particles in the radiation curable resin precursor composition. Therefore, in some embodiments, it is desirable to limit the loading (% of polymerizable group terminated bonding sites on surfaces of the abrasive particles) of the polymeraizable group, such as the loading of alkene terminated groups, to less than about 10%, such as less than about 5%, for example between 2% and 5%.

Figure 3A:
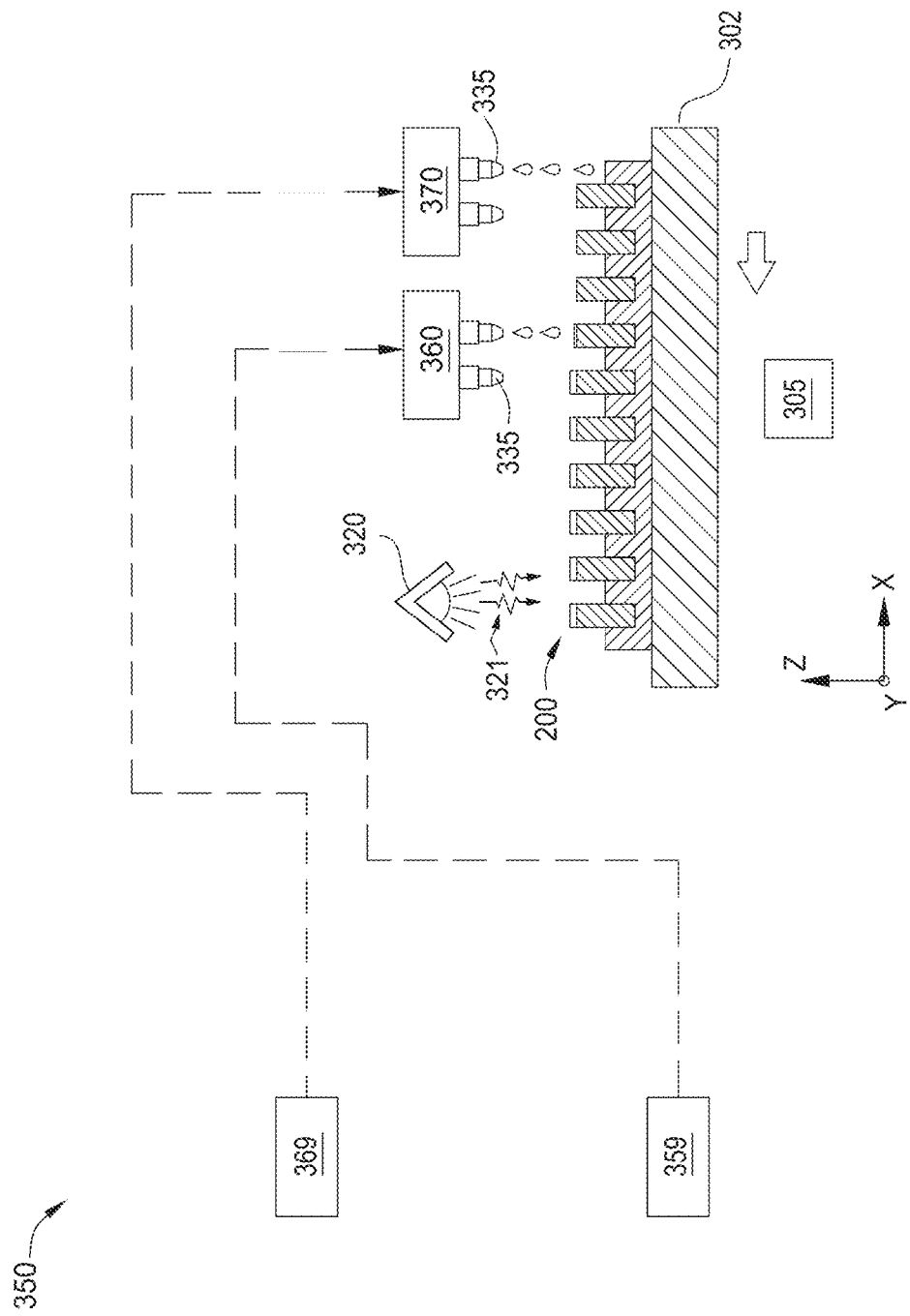
FIG. 3A is a schematic sectional view of an additive manufacturing system used to form an integrated abrasive (IA) polishing pad, such as the IA polishing pads described in FIGS. 2B-2C, according to one embodiment.
Figure 3B:
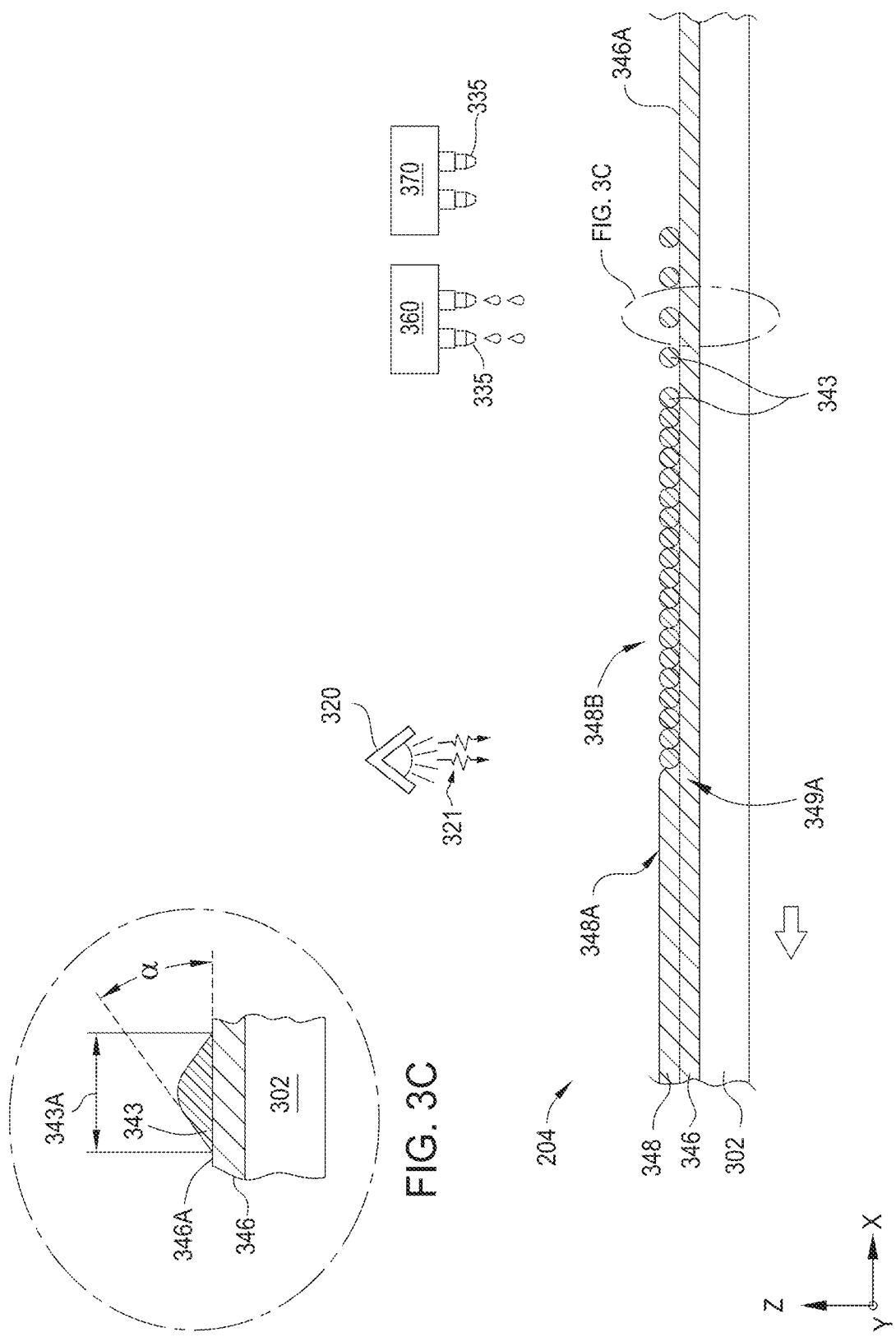
FIGS. 3B and 3C illustrate a curing process using the additive manufacturing system described in FIG. 3A.
Figure 3C:
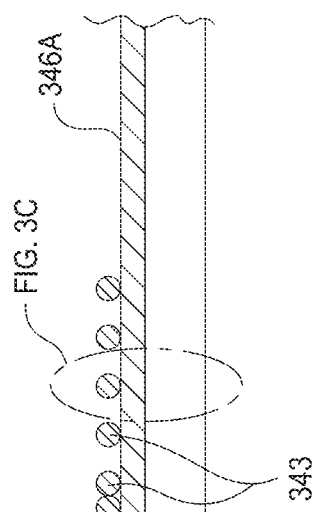

In addition to anchoring abrasive particles to the polishing surfaces of the polishing elements 204b-c, by chemically bonding the abrasive particles to the polishing material thereof, functionalizing the surfaces of the abrasive particles also increases the chemical compatibility of the precursor compositions used to manufacture the polishing pads in an additive manufacturing process, such as the 3D inkjet printing process described in FIGS. 3A-3C.

FIG. 3A is a schematic sectional view of an additive manufacturing system 350 used to form an IA polishing pad, such as IA polishing pads 200b-c, according to embodiments disclosed herein. Herein, the additive manufacturing system 350 has a first printer 360 and a second printer 370 for dispensing droplets of a first precursor composition 359 and a second precursor composition 369 through one or more dispense nozzles 335. The printers 360 and 370 move independently of one another and independently of a manufacturing support 302 during the printing process which enables the placement of droplets of the precursor compositions 359 and 369 at selected locations on the manufacturing support 302 to form a polishing pad, such as the IA polishing pads 200b-c. The selected locations are collectively stored as a CAD-compatible printing pattern which is readable by an electronic controller 305 which directs the motion of the manufacturing support 302, the motion of the printers 360 and 370, and delivery of the droplets from the nozzles 335.

Typically, the first precursor composition 359 is used to form the sub-polishing elements 206b-c and the second precursor composition 369 is used to form the plurality of polishing elements 204b-c of the IA polishing pads 200b-c shown in FIGS. 2B-2C. Herein, the first and second precursor compositions 359 and 369 each comprise a mixture of one or more of functional polymers, functional oligomers, monomers, and/or reactive diluents that are at least monofunctional, and undergo polymerization when exposed to free radicals, Lewis acids, and/or electromagnetic radiation. In some embodiments, the first and/or second precursor compositions 359 and 369 further comprise one or more photoinitiators.

In embodiments described herein, the second precursor composition 369 further comprises surface functionalized abrasive particles, such as surface functionalized ceria particles, surface functionalized alumina particles, surface functionalized silica particles, surface functionalized silica/alumina oxide particles, or combinations thereof, and one or more dispersion and/or suspension agents. In addition to enabling the chemical bonding of abrasive particles to the polishing pad material of the polishing elements described herein, surface functionalization of abrasive particles increases the compatibilities thereof with typical organic liquid resin precursor compositions. This increased compatibility is the result of converting at least a portion of the hydrophilic hydroxyl surface terminated sites of the abrasive particles to hydrophobic polymerizable organic groups. This increased compatibility enables the surface functionalized abrasive particles described herein to enter into a suspension comprising a liquid precursor composition and remain suspended therein, forming a highly stable and homogeneous suspension.

In addition, functionalizing the surfaces of the abrasive particles desirably increases the thermal stability and/or chemical compatibility of precursor composition suspensions. While not wishing to be bound to any particular theory, it is believed that unmodified abrasive particles act as a catalyst for polymerization (by initiating a thermal curing reaction at typical dispensing temperatures) of at least a portion of the components within a precursor composition. This premature polymerization undesirably increases the viscosity of the precursor composition which creates difficulties, such as nozzle clogging, when dispensing droplets thereof. Precursor compositions comprising surface functionalized abrasive particles, with as few as less than about 5% of the abrasive particle's bonding sites bonded to polymerizable groups, such as between about 2% and about 5%, have increased thermal stability and/or chemical compatibility (i.e. improved viscosity for dispensing through the printer nozzles) when compared to precursor compositions comprising untreated abrasive particles.

Herein, the concentration of the surface functionalized abrasive particles in at least the second precursor composition 369 is desirably maintained at between about 1% and about 50% by weight, such as between about 1 wt. % and about 40 wt. %, between about 1 wt. % and about 30 wt. %, between about 1 wt. % and about 20 wt. %, between about 1 wt. % and about 10 wt. %, or between about 1 wt. % and about 5 wt. %, for example less than about 10 wt. % or less than about 5 wt. %. In other embodiments, the surface functionalized abrasives comprise less than about 70 wt. % of the first precursor composition 359. In other embodiments, surface functionalized abrasive particles and unmodified abrasive particles comprise less than about 70 wt. % of the first precursor composition 359.

Herein, functional polymers include multifunctional acrylates including di, tri, tetra, and higher functionality acrylates, such as 1,3,5-triacryloylhexahydro-1,3,5-triazine or trimethylolpropane triacrylate.

Functional oligomers include monofunctional and multifunctional oligomers, acrylate oligomers, such as aliphatic urethane acrylate oligomers, aliphatic hexafunctional urethane acrylate oligomers, diacrylate, aliphatic hexafunctional acrylate oligomers, multifunctional urethane acrylate oligomers, aliphatic urethane diacrylate oligomers, aliphatic urethane acrylate oligomers, aliphatic polyester urethane diacrylate blends with aliphatic diacrylate oligomers, or combinations thereof, for example bisphenol-A ethoxylate diacrylate or polybutadiene diacrylate. In one embodiment, the functional oligomer comprises tetrafunctional acrylated polyester oligomer available from Allnex Corp. of Alpharetta, Ga. as EB40® and the functional oligomer comprises an aliphatic polyester based urethane diacrylate oligomer available from Sartomer USA of Exton, Pa. as CN991.

Monomers include both mono-functional monomers and multifunctional monomers. Mono-functional monomers include tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2- ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl] oxy]ethyl acrylate (e.g. Genomer 1122 from RAHN USA Corporation), 3,3,5-trimethylcyclohexane acrylate, or mono-functional methoxylated PEG (350) acrylate. Multifunctional monomers include diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g., SR9209A from Sartomer®), diethylene glycol diacrylate, diethylene glycol dimethacrylate, dipropylene glycol diacrylate, tripropylene glycol diacrylate, triethylene glycol dimethacrylate, alkoxylated hexanediol diacrylates, or combinations thereof, for example SR562, SR563, SR564 from Sartomer®.

Reactive diluents include monoacrylate, 2-ethylhexyl acrylate, octyldecyl acrylate, cyclic trimethylolpropane formal acrylate, caprolactone acrylate, isobornyl acrylate (IBOA), or alkoxylated lauryl methacrylate.

Photoinitiators used herein include polymeric photoinitiators and/or oligomer photoinitiators, such as benzoin ethers, benzyl ketals, acetyl phenones, alkyl phenones, phosphine oxides, benzophenone compounds and thioxanthone compounds that include an amine synergist, or combinations thereof. For example, in some embodiments photoinitiators include Irgacure® products manufactured by BASF of Ludwigshafen, Germany, such as Irgacure 819, Irgacure 784, Irgacure 379, Irgacure 2022, Irgacure 1173, Irgacure 500, combinations thereof, or equivalent compositions.

Dispersion and/or suspension agents are typically used to stabilize the abrasive particles within a liquid suspension, for example by increasing the electrostatic repulsion (zeta potential) between abrasive particles. Dispersion and/or suspension agents can be used to enable the homogenous suspension of surface functionalized abrasive particles in the liquid of the precursor compositions 359 and 369. Examples of dispersion and/or suspension agents include Hyper® products, such as HypermerKD4 and Hyper KD57, available from Croda, Inc., of New Castle, Del., USA, or BYK Dis2008, BYK JET-9151, or BYK JET-9152 available from BYK-Gardner GmbH of Germany.

Typically, layers formed of the droplets of the precursor compositions 359 and 369 dispensed by the printers 360 and 370 are cured by exposure to radiation 321 from a radiation source 320, such as an ultraviolet light (UV) source, x-ray source, or other type of electromagnetic wave source. Herein, the radiation 321 is UV radiation provided by a UV source. In other embodiments, the precursor compositions 359 and/or 369 are cured by exposure to thermal energy.

FIG. 3B illustrates a curing process using the additive manufacturing system 350 of FIG. 3A. FIG. 3B shows a portion of one or more previously formed layers 346 of a polishing element, such as polishing element 204b-c, disposed on the manufacturing support 302. During processing, the printers 360 and 370 deliver a plurality of droplets 343 of one or more precursor compositions, such as the second precursor composition 369, to a surface 346A of the one or more first layers 346. The plurality of droplets 343 form one of a plurality of second layers 348 which, in FIG. 3B, includes a cured portion 348A and an uncured portion 348B where the cured portion has been exposed to radiation 321 from the radiation source 320. Herein, the thickness of the cured portion 348A of the first layer is between about 0.1 micron and about 1 mm, such as between about 5 microns and about 100 microns, for example between about 25 microns and about 30 microns.

FIG. 3C is a close up cross-sectional view of a droplet 343 dispensed onto the surface 346A of the one or more previously formed layers 346. As shown in FIG. 3C, once dispensed onto the surface 346A, the droplet 343 spreads to a droplet diameter 343A having a contact angle α. The droplet diameter 343A and contact angle α are a function of at least the material properties of the precursor composition, the energy at the surface 346A (surface energy) of the one or more previously formed layers 346, and time although the droplet diameter 343A and the contact angle α will reach an equilibrium after a short amount of time, for example less than about one second, from the moment that the droplet contacts the surface 346A of the one or more previously formed layers 346. In some embodiments, the droplets 343 are cured before reaching an equilibrium diameter and contact angle. Typically, the droplets 343 have a diameter of between about 10 and about 200 micron, such as between about 50 micron and about 70 microns before contact with the surface 346A and spread to between about 10 and about 500 micron, between about 50 and about 200 microns, after contact therewith.

Herein, the precursor compositions 359 and 369 are formulated to have a viscosity between about 80 cP and about 110 cP at about 25° C., between about 15 cP and about 30 cP at about 70° C., or between 10 cP and about 40 cP for temperatures between about 50° C. and about 150° C. so that the mixtures may be effectively dispensed through the dispense nozzles 335 of the printers 360 and 370. In some embodiments, the second precursor composition 369 is recirculated or otherwise mechanically agitated to ensure that the surface functionalized abrasive particles remain homogenously suspended in the liquid precursor mixture.

Figure 4A:
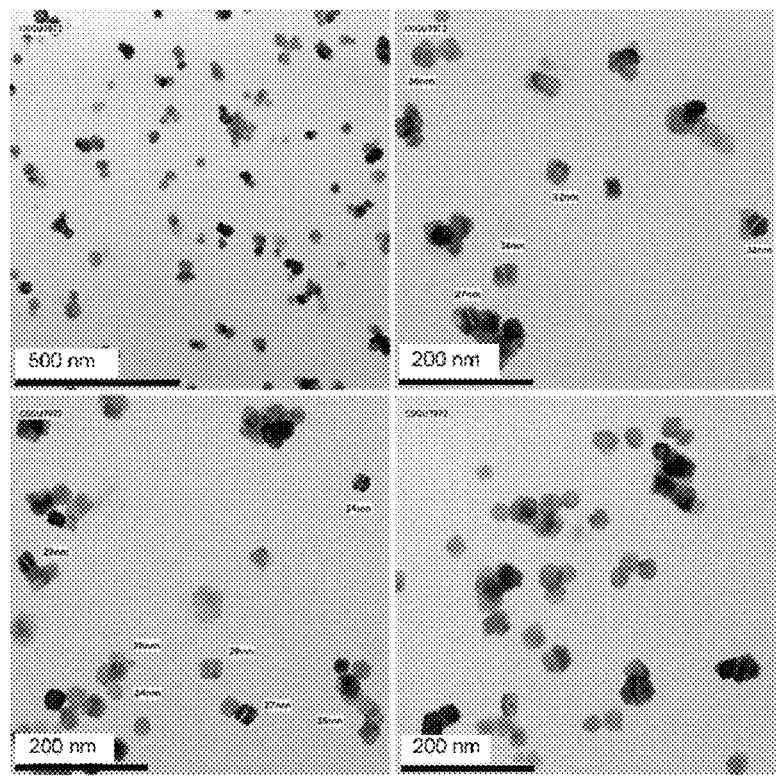
FIGS. 4A-4B illustrate the properties of a layer formed from a precursor comprising surface functionalized abrasive particles, according to one embodiment.
Figure 4B:
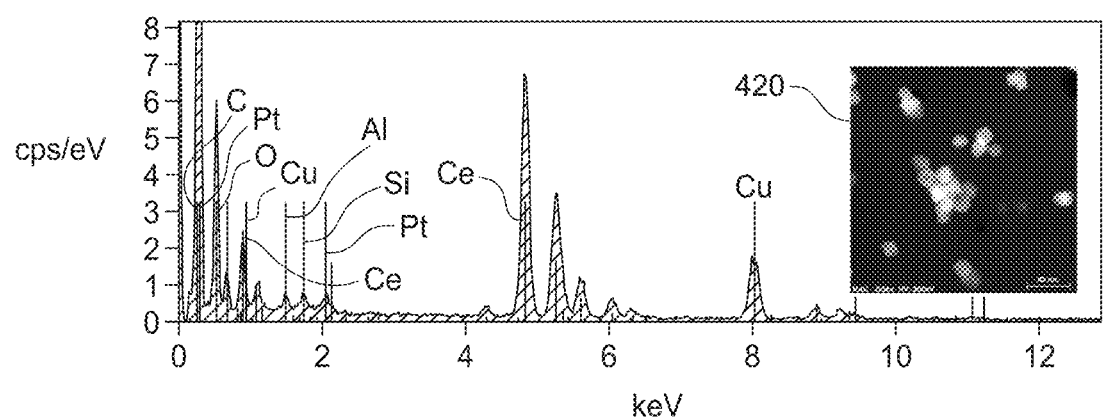

FIGS. 4A-4B illustrate the properties of a layer formed from a precursor mixture comprising surface functionalized abrasive particles formed according to embodiments described herein. FIG. 4A is a TEM of a layer of polishing material having surface functionalized abrasives disposed therein formed using the embodiments described in FIGS. 3A-3C from a precursor having a formulation described in Table 2. In this embodiment, the surface functionalized ceria particles and a suspension agent were mixed in an acrylic monomer (IBOA) to form a mixture. The mixture was milled using a probe sonicator to break up larger agglomerations of the ceria particles into smaller agglomerations or individual particles having a mean diameter between about 30 nm and about 300 nm. In other embodiments, other types of milling processes, for example ball milling, are used to reduce larger agglomerations of abrasive particles to desirable sizes either before, during, or after mixing of the precursor. After milling, the remaining components of Table 2 were added to the mixture to form the precursor composition which was homogenized by ultrasonication so that the surface functionalized abrasive particles were uniformly distributed therein. As shown in the images in FIG. 4A the ceria particles have a uniform distribution within the printed layer. FIG. 4B shows an EDX spectra of the ceria particles (shown in inset image 420) disposed in the layer formed from the precursor shown in Table 2 where Ce, O, and Si signals are attributable to ceria particles and the bonded dimethyl vinyl silane group which indicates successful surface functionalization of the treated ceria particle surfaces with the polymerizable dimethyl vinyl silane group.

TABLE 2

| Component | wt. % |
|---|---|
| ceria | 4.7% |
| isobornyl acrylate (IBOA) | 33.2% |
| suspension agent (BYK9152) | 1.5% |
| chloro(dimethyl)vinylsilane | 1.8% |
| tetrafunctional acrylated polyester oligomer (EB40) | 38.9% |
| aliphatic polyester based urethane diacrylate oligomer (CN991) | 18% |
| Photoinitiator (Irgacure 819) | 1.9% |

Figure 5:
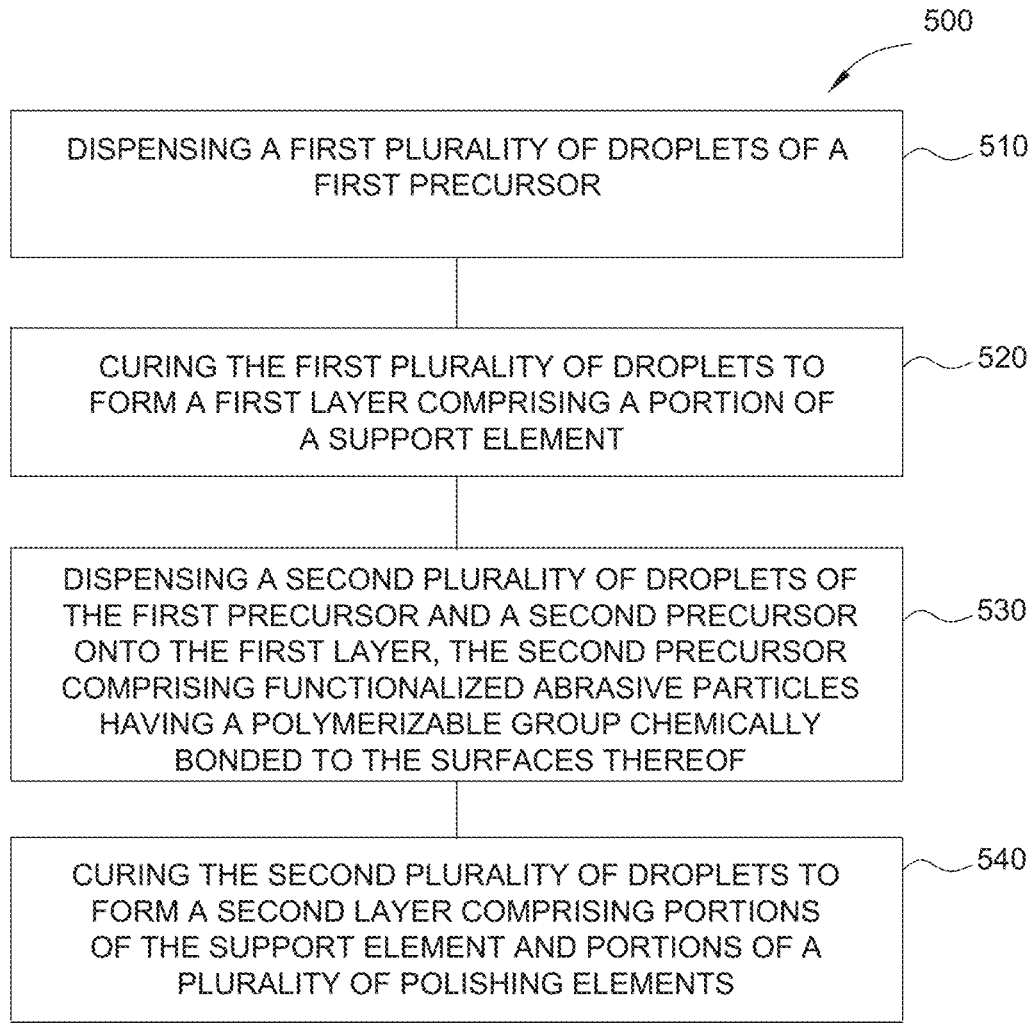
FIG. 5 is a flow diagram illustrating a method of forming a polishing pad, such as the integrated abrasive (IA) polishing pads described in FIG. 2A-2B, according to one embodiment.

FIG. 5 is a flow diagram illustrating a method 500 of forming a polishing pad, such as IA polishing pads 200b-c of FIG. 2A-2B, according to embodiments described herein. At activity 510 the method includes dispensing a first plurality of droplets of a first precursor, such as the first precursor 359 described in FIGS. 3A-3C. Herein, the first precursor comprises a curable resin composition and is a mixture of one or more functional polymers, functional oligomers, monomers, reactive diluents, or combinations thereof. In this embodiment, the first precursor further comprises one or more photoinitiators to enable curing of the dispensed first plurality of droplets using UV radiation. Herein, the precursors used in method 500 have a viscosity between about 80 cP and about 110 cP at about 25° C., between about 15 cP and about 30 cP at about 70° C., or between 10 cP and about 40 cP for temperatures between about 50° C. and about 150° C. enabling droplets therefrom to be dispensed through dispense nozzles 335 of the printer 360.

At activity 520 the method 500 includes curing the first plurality of droplets to form one of a plurality of first layers, such as the one or more previously formed layers 346 shown in FIGS. 3B-3C, the one of the plurality of first layers herein comprising a portion of a sub-polishing element, such as the sub-polishing elements 206b-c of IA polishing pads 200b-c. Herein, the plurality of first droplets are cured by exposure to UV radiation from a UV radiation source, such as radiation source 320, having a wavelength of between about 170 nm and about 500 nm.

At activity 530 the method 500 includes dispensing a second plurality of droplets of the first precursor and a second precursor onto the plurality of first layers, the second precursor comprising surface functionalized abrasive particles having at least one polymerizable group chemically bonded to the surfaces thereof. Herein, the surface functionalized abrasive particles comprise the reaction product of hydroxyl terminated metal oxide nanoparticles, such as ceria, with an organic compound, such as a silane organic compound, a cyanate compound, a sulfonic acid compound, a phosphoric acid organic compound, a carboxylic acid compound, or combinations thereof. In some embodiments, the reaction product of the hydroxyl terminated metal oxide nanoparticles and the organic compound forms an alkene terminated abrasive particle. In this embodiment, the loading (% of surface sites chemically bonded to a polymerizable compound) is less than about 50%, for example less than about 50% of the surface sites are alkene terminated, and the concentration of surface functionalized abrasive particles in the second precursor is between about 1 wt. % and about 50 wt. %. In another embodiment, the total concentration of abrasive particles, including non-functionalized abrasive particles in the second precursor is less than about 70%.

Typically, the second precursor comprises a mixture of one or more one or more functional polymers, functional oligomers, monomers, reactive diluents, or combinations thereof. In this embodiment, the second precursor further comprises a photoinitiator to enable UV curing and a dispersion and/or suspension agent to stabilize the functionalized abrasive particles in the second precursor mixture, and to maintain their suspension therein. In this embodiment, the surface functionalized abrasive particles, or agglomerations thereof, have a mean diameter of between about 10 nm and about 5 micron, such as between about 30 nm and 500 nm, such as between about 30 nm and 300 nm, for example between about 100 nm and about 150 nm.

At activity 540 the method 500 includes curing the second plurality of droplets to form a second layer, the second layer comprising portions of the sub-polishing element and portions of a plurality of polishing elements, such as the second polishing elements 204b-c. Herein, curing the second plurality of droplets comprises exposing the second plurality of droplets to UV radiation thereby polymerizing the second plurality of droplets and forming chemical bonds at the interfaces therebetween. In this manner, chemical bonds, such as covalent and/or ionic bonds, are formed between polymer materials comprising portions of the sub-polishing element and polymer materials comprising portions of the polishing elements at the interfaces thereof. Further, the surface functionalized abrasive particles serve as a cross-linking reagent between reaction products of the second precursor mixture by forming chemical bonds therewith.

The method described above is used with the IA polishing pads described herein or with any polishing pad where chemically bonding abrasive particles to the polishing pad material is desired. Benefits of the method include forming IA polishing pads with tunable polishing properties that are compatible with diamond conditioning during, before, or after a CMP process. Other embodiments comprise forming IA polishing pads by delivering droplets containing different precursors that have differing concentrations of abrasive particles so that the abrasive particle concentration can be varied across the surface of the polishing pad material as shown in FIG. 6.

Figure 6:
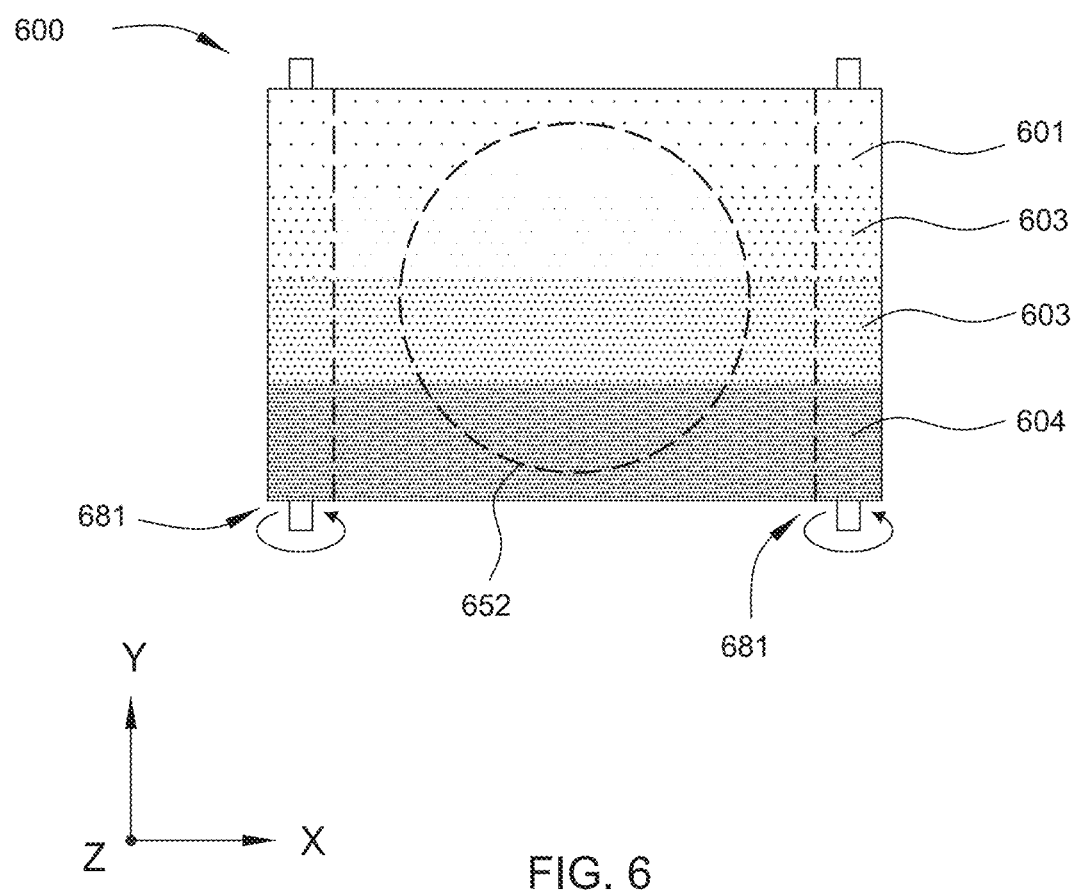
FIG. 6 is a schematic top view of an integrated abrasive (IA) polishing pad, according to another embodiment.

FIG. 6 is a schematic top view of an IA polishing pad 600 used with web based or roll-to-roll type polishing system. The IA polishing pad 600 is formed using an additive manufacturing system, such as the additive manufacturing system 350 shown in FIGS. 3A-3B. Herein, the IA polishing pad 600 is disposed over a polishing platen 652 between a first roll 681 and a second roll 682. The IA polishing pad 600 comprises a concentration gradient of abrasive particles bonded to the polishing pad material thereof across a polishing surface 608. Herein, the IA polishing pad 600 has a first region 602 comprising a low concentration of abrasive particles, a second region 604 comprising a high concentration of abrasive particles, and intermediate regions 603 comprising intermediate concentrations of abrasive particles. The regions 602 to 604 of varying concentrations of abrasive particles are formed according to embodiments herein from a plurality of precursor compositions, each comprising a different concentration of surface functionalized abrasive particles. In other embodiments, the regions of varying concentrations are formed by alternating droplets of a precursor composition comprising a high concentration of abrasive particles with a precursor composition comprising a low concentration of abrasive particles.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a polishing article, comprising:
dispensing a first plurality of droplets of a first precursor;
curing the first plurality of droplets to form a first layer comprising a portion of a sub-polishing element;
dispensing a second plurality of droplets of the first precursor and a second precursor onto the first layer, the second precursor comprising functionalized abrasive particles having a polymerizable group chemically bonded to surfaces thereof, wherein less than about 50% of bonding sites of the surfaces of the functionalized abrasive particles have the polymerizable group bonded thereto; and
curing the second plurality of droplets to form a second layer comprising portions of the sub-polishing element and portions of a plurality of polishing elements.

2. The method of claim 1, further comprising milling the second precursor so that the functionalized abrasive particles, or combinations thereof, have a mean diameter of between about 10 nm and about 300 nm.

3. The method of claim 1, further comprising dispensing a third plurality of droplets of the second precursor onto the second layer and curing the third plurality of droplets to form a third layer comprising portions of the plurality of polishing elements.

4. The method of claim 1, wherein curing the second plurality of droplets comprises chemically bonding a pad material of the plurality of polishing elements to a sub-polishing material of the sub-polishing element at interfaces therebetween.

5. The method of claim 2, wherein the functionalized abrasive particles comprise metal oxide nanoparticles.

6. The method of claim 1, wherein the functionalized abrasive particles, or agglomerations thereof, have a mean diameter between about 10 nm and about 5 micron, and wherein the functionalized abrasive particles comprise between about 1 wt. % and about 50 wt. % of the second precursor.

7. The method of claim 1, wherein curing the second plurality of droplets comprises exposure thereof to UV radiation.

8. The method of claim 1, wherein the functionalized abrasive particles comprise a reaction product of metal oxide nanoparticles and a silane compound, a cyanate compound, a sulfonic acid compound, a phosphoric acid compound, a carboxylic acid compound, or combinations thereof.

9. The method of claim 1, wherein the second precursor further comprises a mixture of one or more functional polymers, functional oligomers, monomers, reactive diluents, or combinations thereof.

10. The method of claim 1, wherein the polishing elements have medium or high modulus of elasticity and the sub-polishing element has a low or medium modulus of elasticity, and wherein the modulus of elasticity of the polishing elements is different from the modulus of elasticity of the sub-polishing element.

11. The method of claim 1, wherein the first precursor comprises a mixture of one or more functional polymers, functional oligomers, monomers, reactive diluents, or combinations thereof.

12. A method of forming a polishing article, comprising:
forming a sub-polishing element from a first plurality of droplets of a first precursor; and
forming a plurality of polishing elements disposed in, and extending from, the sub-polishing element by dispensing a second plurality of droplets of a second precursor, the second precursor comprising treated metal oxide nanoparticles having polymerizable compounds bonded to less than about 50% of bonding sites on the surface of the metal oxide nanoparticles, wherein the treated metal oxide nanoparticles comprise a reaction product of metal oxide nanoparticles with a silane compound, a cyanate compound, a sulfonic acid compound, a phosphoric acid compound, a carboxylic acid compound, or combinations thereof.

13. The method of claim 12, wherein the first precursor comprises a curable resin composition comprising a mixture of one or more functional polymers, functional oligomers, monomers, reactive diluents, or combinations thereof.

14. The method of claim 13, wherein forming the sub-polishing element comprises curing the first precursor by exposure to UV radiation.

15. The method of claim 12, wherein forming the plurality of polishing elements comprises chemically bonding a pad material of the plurality of polishing elements to the sub-polishing element at interfaces therebetween.

16. A method of forming a polishing article, comprising:
dispensing a first plurality of droplets of a first precursor comprising a curable resin composition comprising a mixture of one or more functional polymers, functional oligomers, monomers, reactive diluents, or combinations thereof;
curing the first plurality of droplets to form a first layer comprising a portion of a sub-polishing element;
dispensing a second plurality of droplets of the first precursor and a second precursor comprising a reaction product of metal oxide nanoparticles and a a polymerizable group selected from a group consisting of silane compound, a cyanate compound, a sulfonic acid compound, a phosphoric acid compound, a carboxylic acid compound, or combinations thereof onto the first layer, wherein less than about 50% of bonding sites of the surfaces of the metal oxide nanoparticles have the polymerizable group bonded thereto; and
curing the second plurality of droplets to form a plurality of polishing elements disposed in, and extending from, the sub-polishing element.

17. The method of claim 16, further comprising milling the second precursor so that the nanoparticles have a mean diameter of between about 10 nm and about 300 nm.

18. The method of claim 16, wherein at least one of the first precursor and the second precursor further comprises one or more photoinitiators.

19. The method of claim 16, wherein the second precursor further comprises a mixture of one or more functional polymers, functional oligomers, monomers, reactive diluents, or combinations thereof.

* * * * *